US012745468B2

(12) United States Patent
Singh et al.

(10) Patent No.: US 12,745,468 B2
(45) Date of Patent: Sep. 22, 2026

(54) IMAGE SENSOR ARCHITECTURES THAT EMPLOY MULTI-POTENTIAL DYNAMIC SUBSTRATE BIASING

(71) Applicant: Apple Inc., Cupertino, CA (US)

(72) Inventors: Ritu Raj Singh, Santa Clara, CA (US); John L. Orlowski, Santa Clara, CA (US); Oray O. Cellek, Los Altos, CA (US); Ashirwad Bahukhandi, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 385 days.

(21) Appl. No.: 18/228,534

(22) Filed: Jul. 31, 2023

(65) Prior Publication Data

US 2025/0048752 A1 Feb. 6, 2025

(51) Int. Cl.
*H10F 39/18* (2025.01)
*H10F 39/00* (2025.01)

(52) U.S. Cl.
CPC ......... *H10F 39/18* (2025.01); *H10F 39/8037* (2025.01); *H10F 39/807* (2025.01); *H10F 39/809* (2025.01)

(58) Field of Classification Search
CPC .... H10F 39/18; H10F 39/8037; H10F 39/807; H10F 39/809; H10F 39/199; H10F 39/80373; H10F 39/811; H10F 39/813
See application file for complete search history.

(56) References Cited

U.S. PATENT DOCUMENTS 6,476,783 B2 11/2002 Matthies et al.
7,349,574 B1 3/2008 Sodini et al.
(Continued)

FOREIGN PATENT DOCUMENTS

CN 105229788 1/2016
CN 106104565 11/2016
(Continued)

OTHER PUBLICATIONS

Charlet et al., "Chip-to-chip interconnections based on the wireless capacitive coupling for 3D integration," *Microelectronic Engineering,* vol. 83, 2006, pp. 2195-2199.
(Continued)

*Primary Examiner* — Thanh Luu
*Assistant Examiner* — Mai Thi Ngoc Tran
(74) *Attorney, Agent, or Firm* — Brownstein Hyatt Farber Schreck, LLP

(57) ABSTRACT

An image sensor includes a semiconductor substrate. The semiconductor substrate includes a set of one or more substrate portions. Each substrate portion of the set of one or more substrate portions is electrically isolated from other substrate portions of the set of substrate portions. The image sensor further includes a set of photodiodes, a set of charge storage nodes, a set of charge transfer gates, and a control circuit. Each charge transfer gate of the set of charge transfer gates is disposed on and biased by a different substrate portion of the set of substrate portions. Each charge transfer gate of the set of charge transfer gates is operable to selectively connect a respective photodiode of the set of photodiodes to the charge storage node. The control circuit is operable to dynamically bias each substrate portion of the set of substrate portions independently of each other substrate portion of the set of substrate portions.

18 Claims, 29 Drawing Sheets

(56) References Cited

U.S. PATENT DOCUMENTS

| | | | |
|---|---|---|---|
| 8,111,306 | B2 | 2/2012 | Kuruma et al. |
| 8,128,890 | B2 | 3/2012 | Tibbe et al. |
| 8,497,460 | B2 | 7/2013 | Nakayama |
| 8,792,020 | B2 | 7/2014 | Lee et al. |
| 8,957,358 | B2 | 2/2015 | Wan et al. |
| 8,963,886 | B2 | 2/2015 | Wassvik |
| 8,975,752 | B2 | 3/2015 | Chow et al. |
| 9,312,294 | B2 | 4/2016 | Chuang et al. |
| 9,349,035 | B1 | 5/2016 | Gerber |
| 9,362,320 | B2 | 6/2016 | Yamashita et al. |
| 9,372,283 | B2 | 6/2016 | Nikoobakht |
| 9,437,132 | B2 | 9/2016 | Rappoport et al. |
| 9,445,026 | B2 | 9/2016 | Kobayashi et al. |
| 9,594,476 | B2 | 3/2017 | Yang et al. |
| 9,720,535 | B2 | 8/2017 | Yang et al. |
| 9,860,467 | B2 | 1/2018 | Kim et al. |
| 10,026,771 | B1 | 7/2018 | Lee et al. |
| 10,042,467 | B2 | 8/2018 | Schwartz et al. |
| 10,146,258 | B2 | 12/2018 | Sinha et al. |
| 10,181,070 | B2 | 1/2019 | Smith et al. |
| 10,205,898 | B2 | 2/2019 | McMahon et al. |
| 10,360,431 | B2 | 7/2019 | Gozzini et al. |
| 10,394,014 | B2 | 8/2019 | Sakai |
| 10,481,420 | B2 | 11/2019 | Bonodo et al. |
| 10,635,878 | B2 | 4/2020 | Yi et al. |
| 10,658,404 | B2 | 5/2020 | Abe et al. |
| 10,685,202 | B2 | 6/2020 | Kim et al. |
| 10,713,458 | B2 | 7/2020 | Bhat et al. |
| 10,733,408 | B2 | 8/2020 | Bok |
| 10,733,931 | B2 | 8/2020 | Jung et al. |
| 10,739,807 | B2 | 8/2020 | Lallement et al. |
| 10,838,126 | B2 | 11/2020 | Wang et al. |
| 10,868,064 | B2 | 12/2020 | Wada et al. |
| 11,073,712 | B2 | 7/2021 | Yeke Yazdandoost et al. |
| 11,121,165 | B2 | 9/2021 | Lee et al. |
| 11,177,311 | B2 | 11/2021 | Juen et al. |
| 11,619,857 | B2 | 4/2023 | Li |
| 2005/0002448 | A1 | 1/2005 | Knight et al. |
| 2005/0174335 | A1 | 8/2005 | Kent et al. |
| 2008/0054320 | A1 | 3/2008 | Solhusvik et al. |
| 2010/0045364 | A1 | 2/2010 | Law et al. |
| 2011/0115041 | A1 | 5/2011 | Dan et al. |
| 2012/0262408 | A1 | 10/2012 | Pasquero et al. |
| 2014/0133715 | A1 | 5/2014 | Ballard et al. |
| 2015/0177884 | A1 | 6/2015 | Han |
| 2015/0177979 | A1 | 6/2015 | Johansson et al. |
| 2016/0163753 | A1 | 6/2016 | Yu et al. |
| 2018/0074627 | A1 | 3/2018 | Kong et al. |
| 2018/0342544 | A1 | 11/2018 | Lee et al. |
| 2018/0358393 | A1 | 12/2018 | Sato et al. |
| 2019/0310724 | A1 | 10/2019 | Yeke Yazdandoost et al. |
| 2021/0240026 | A1 | 8/2021 | Yeke Yazdandoost et al. |
| 2021/0311240 | A1 | 10/2021 | Siddique et al. |
| 2022/0115428 | A1 | 4/2022 | Borremans |
| 2022/0272291 | A1* | 8/2022 | Mas ...................... G01S 7/4863 |
| 2022/0320173 | A1 | 10/2022 | Chou et al. |
| 2022/0382120 | A1 | 12/2022 | Li et al. |
| 2023/0068723 | A1 | 3/2023 | Hsieh et al. |
| 2023/0236469 | A1 | 7/2023 | Li et al. |
| 2023/0261029 | A1 | 8/2023 | Ebiko |
| 2023/0411431 | A1* | 12/2023 | Chung ................. H04N 25/709 |
| 2024/0064432 | A1 | 2/2024 | Yan et al. |
| 2024/0107782 | A1 | 3/2024 | Lee et al. |
| 2024/0388811 | A1* | 11/2024 | Fadida ................. H04N 25/701 |
| 2025/0102628 | A1 | 3/2025 | Tan et al. |
| 2025/0221077 | A1* | 7/2025 | Kim ...................... H10F 39/182 |

FOREIGN PATENT DOCUMENTS

| | | |
|---|---|---|
| CN | 106298856 | 1/2017 |
| CN | 107004130 | 8/2017 |
| CN | 107870689 | 4/2018 |
| JP | 2009042870 | 2/2009 |
| KR | 1020170113066 | 10/2017 |
| WO | WO 20/052607 | 5/2010 |
| WO | WO 15/005959 | 1/2015 |
| WO | WO 15/191557 | 12/2015 |
| WO | WO 17/211152 | 12/2017 |
| WO | WO 18/040512 | 3/2018 |
| WO | WO 22/061016 | 3/2022 |

OTHER PUBLICATIONS

Han et al., "Deep Trench Isolation and Inverted Pyramid Array Structures Used to Enhance Optical Efficiency of Photodiode in CMOS Image Sensor via Simulations," Sensors, vol. 20, No. 3062, 2020, pp. 1-14.

Neubrech et al Science Advances 2020, vol. 6: eabc2709, Sep. 4, 2020, 21 pages.

U.S. Appl. No. 17/891,963, filed Aug. 19, 2022, Yan et al.

U.S. Appl. No. 17/950,325, filed Sep. 22, 2022, Lee et al.

* cited by examiner

IMAGE SENSOR ARCHITECTURES THAT EMPLOY MULTI-POTENTIAL DYNAMIC SUBSTRATE BIASING

FIELD

The described embodiments generally relate to image sensors and, more particularly, to low power image sensors and/or image sensors that provide advantages such as a smaller footprint, improved image capture quality, operating efficiencies, and so on.

BACKGROUND

Many of today's devices include an image sensor. Image sensors (or cameras) may be used to acquire photographs, video, navigation or tracking images (or videos), a depth map, a thermal map, and so on. The types of devices that may include an image sensor include mobile phones, computers, wearable devices, vehicle navigation systems, robots, satellites, gaming systems, home appliances, and so on.

An image sensor typically includes an array of pixels. When an image sensor is used to capture an image frame (i.e., a set of pixel values for the array of pixels), the pixels may be exposed to electromagnetic radiation for a discrete period of time, known as an integration time. All of the pixels may be exposed to electromagnetic radiation (e.g., visible and/or non-visible electromagnetic radiation) at the same time (e.g., in a global shutter mode of operation), or different pixels may be exposed to electromagnetic radiation at different times (e.g., integration times for different lines of pixels may be started at different times, in what is known as a rolling shutter mode of operation). Although some image sensors may have a physical shutter, the pixels of most image sensors are associated with respective electronic shutters. An electronic shutter clears the charge that has been integrated by a pixel's photodiode just before an integration time is to begin, and a readout circuit is used to read the charge integrated by the photodiode out to a storage node at the end of the integration period.

Various aspects of an image sensor may be improved by using one or more charge pumps to drive the gate voltages of various pixel transistors to different potentials. For example, a pixel full well capacity may be increased, the charge transfer time between a photodiode and a charge storage node may be reduced, the number of pixel defects in an image sensor may be reduced, and so on. Sometimes, a potential generated by a charge pump may be between the power rail voltages of an image sensor. Sometimes, a potential generated by a charge pump may be outside the power rail voltages of an image sensor (e.g., an image sensor that is operated with power rail voltages of zero (0) volts (V) and 2.8V may be associated with a charge pump that temporarily drives the gate voltage(s) of one or more of pixel transistors to a negative voltage).

SUMMARY

Embodiments of the systems, devices, methods, and apparatus described in the present disclosure employ multi-potential dynamic substrate biasing. An image sensor architecture that employs multi-potential dynamic substrate biasing can, in some embodiments, be operated without a charge pump. Charge pumps generally consume a lot of power and silicon area, so operating an image sensor without a charge pump can enable the image sensor to operate at a lower power and occupy a smaller silicon area (e.g., operate at microWatt (μW) power levels within a sub-square millimeter (sub-$mm^2$) silicon footprint). Moreover, operating an image sensor without a charge pump can simplify and shrink the size of a camera module that includes the image sensor (e.g., due to the elimination of passive capacitors). Eliminating charge pumps also eliminates a source of noise generation and noise coupling into an image sensor and its supporting electrical system, and can improve image capture quality.

In addition to or instead of eliminating charge pumps, multi-potential dynamic substrate biasing can improve the operation of an image sensor (e.g., regardless of whether the image sensor is operated using one or more charge pumps). For example, an image sensor architecture that employs multi-potential dynamic substrate biasing can improve image sensor pixel performance parameters (e.g., increase a pixel full well capacity, decrease pixel dark current, and/or decrease image lag).

To achieve the above and/or other advantages, various image sensor architectures that employ multi-potential dynamic substrate biasing are described.

In a first aspect, the present disclosure describes an image sensor. The image sensor may include a semiconductor substrate, and the semiconductor substrate may include a set of substrate portions. Each substrate portion of the set of substrate portions may be electrically isolated from other substrate portions of the set of substrate portions. The image sensor may further include a set of photodiodes, a charge storage node, a set of charge transfer gates, and a control circuit. Each charge transfer gate of the set of charge transfer gates may be disposed on and biased by a different substrate portion of the set of substrate portions. Each charge transfer gate of the set of charge transfer gates may be operable to selectively connect a respective photodiode of the set of photodiodes to the charge storage node. The control circuit may be operable to dynamically bias each substrate portion of the set of substrate portions independently of each other substrate portion of the set of substrate portions.

In a second aspect, the present disclosure describes another image sensor. The image sensor may include at least one substrate, and a set of pixels on the at least one substrate. A pixel in the set of pixels may include a first substrate portion of the at least one substrate; a second substrate portion of the at least one substrate, the second substrate portion electrically isolated from the first substrate portion; a photodiode; a charge storage node; a charge transfer gate on and biased by the first substrate portion, the charge transfer gate operable to selectively couple the photodiode to the charge storage node, and at least one transistor on and biased by the second substrate portion.

In a third aspect, the present disclosure describes another image sensor. The image sensor may include a semiconductor substrate, a pixel, and a control circuit. The pixel may include a photodiode, a charge storage node, and a charge transfer gate disposed on and biased by the substrate. The charge transfer gate may be operable to selectively connect the photodiode to the charge storage node. The control circuit may be operable to dynamically bias the substrate to three or more different potentials. The different potentials may be applied during different modes of operation of the pixel.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
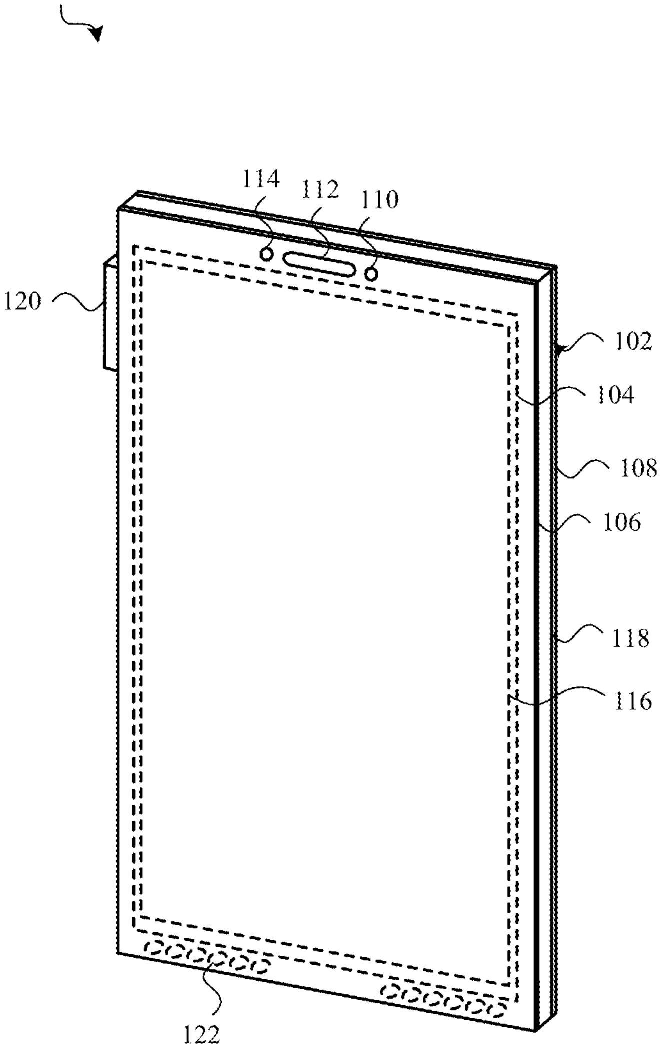
FIGS. 1A and 1B show an example of a device (an electronic device) that includes an image sensor.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

As previously mentioned, charge pumps consume a lot of power. However, charge pumps are useful in that they can produce voltages outside of an image sensor's power rails and can bias the components of a pixel in ways that increase pixel full well capacity, decrease pixel dark current, or reduce the charge transfer time between a photodiode and a charge storage node. Charge pumps can also reduce the number of pixel defects in an image sensor.

In various embodiments of the image sensors control circuits described herein, the use of charge pumps can be avoided by not only applying different potentials to the gates of a pixel's transistors, but also dynamically applying different potentials to one or more substrates or substrate portions on which a pixel's components are formed. For example, a pixel may be formed on a substrate or substrate portion, and the substrate or substrate portion may be dynamically driven to one potential (e.g., 0.8V, 1.0V, or 1.5V) during some modes of operation of the pixel, and to a different potential (e.g., 0V or ground) during one or more other modes of operation of the pixel. Coupled with driving the gates of transistors to different potentials during different modes of operation, biasing the substrate(s) or substrate portion(s) on which a pixel's components are disposed may bias different transistors into different modes of operation, such as accumulation, linear, cut-off, or saturation modes. In some cases, the bias voltages (or potentials) may be within the power rails of an image sensor and may be generated without the use of charge pumps. For example, the bias voltages may be generated using supply voltages or one or more low-dropout (LDO) regulators. LDO regulators designed for substrate biasing may consume a lot less power and silicon area than charge pumps.

These and other systems, devices, methods, and apparatus are described with reference to FIGS. 1A-16. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "above", "below", "left", "right", etc. is used with reference to the orientation of some of the components in some of the figures described below. Because components in various embodiments can be positioned in a number of different orientations, directional terminology is used for purposes of illustration and is not always limiting. The directional terminology is intended to be construed broadly, and therefore should not be interpreted to preclude components being oriented in different ways. Also, as used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

Figure 1B:
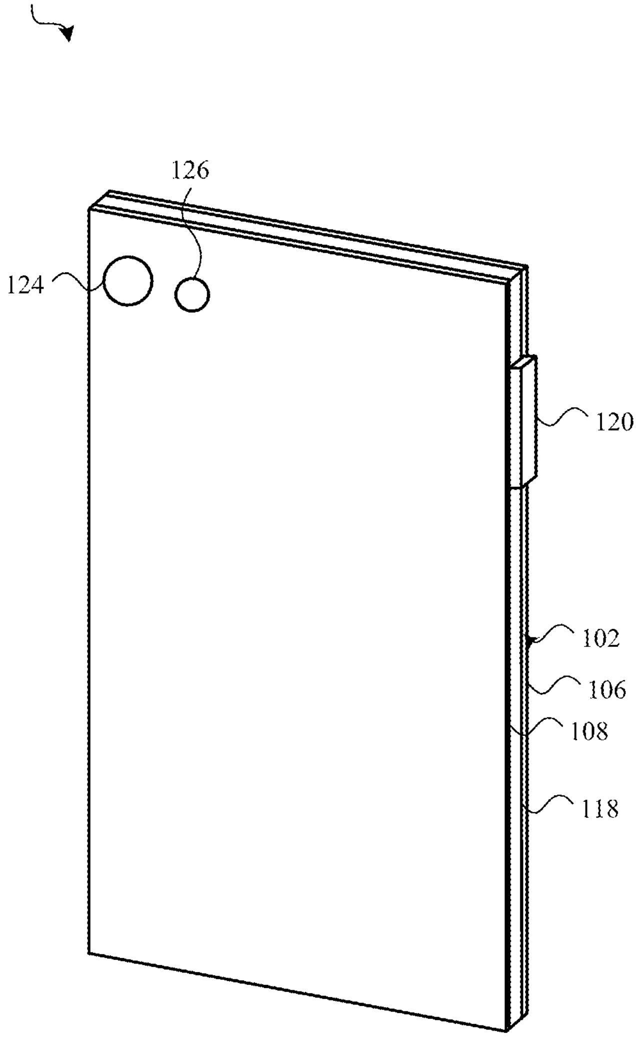

FIGS. 1A and 1B show an example of a device 100 (an electronic device) that includes an image sensor (e.g., a front or rear-facing camera 110, 124, or an array of sensors 116). The image sensor may be used, for example, to acquire one or more of photographs, video, navigation or tracking images (or videos), a depth map, a thermal map, and so on.

The device's dimensions and form factor, including the ratio of the length of its long sides to the length of its short sides, suggest that the device 100 is a mobile phone (e.g., a smartphone). However, the device's dimensions and form factor are arbitrarily chosen, and the device 100 could alternatively be any portable electronic device including, for example, a mobile phone, tablet computer, portable computer or laptop computer, portable music player, wearable device (e.g., one or more of a watch, health or fitness monitor, earbud, headset, goggles, pair of glasses, and so on), portable terminal, vehicle navigation system, robot navigation system, gaming system, gaming control circuit, gaming accessory, augmented reality (AR) device, virtual reality (VR) device, mixed reality (MR) device, or other portable or mobile device. The device 100 could also be a wearable device or, alternatively, a device that is semi-permanently located (or installed) at a single location (e.g., a door lock, thermostat, refrigerator, or other appliance). FIG. 1A shows a front isometric view of the device 100, and FIG. 1B shows a rear isometric view of the device 100. The device 100 may include a housing 102 that at least partially surrounds a display 104. The housing 102 may include or support a front cover 106 or a rear cover 108. The front cover 106 may be positioned over the display 104 and may provide a window through which the display 104 (including images displayed thereon) may be viewed by a user. In some embodiments, the display 104 may be attached to (or abut) the housing 102 and/or the front cover 106.

The display 104 may include one or more light-emitting elements or pixels, and in some cases may be a light-emitting diode (LED) display, an organic LED (OLED) display, a liquid crystal display (LCD), an electroluminescent (EL) display, a laser projector, or another type of electronic display. In some embodiments, the display 104, the front cover 106, or a stack including the display 104 and/or front cover 106 may include, or be associated with, one or more touch and/or force sensors that are configured to detect a touch and/or a force applied to a surface of the front cover 106.

The various components of the housing 102 may be formed from the same or different materials. For example, a sidewall 118 of the housing 102 may be formed using one or more metals (e.g., stainless steel), polymers (e.g., plastics), ceramics, or composites (e.g., carbon fiber). In some cases, the sidewall 118 may be a multi-segment sidewall including a set of antennas. The antennas may form structural components of the sidewall 118. The antennas may be structurally coupled (to one another or to other components) and electrically isolated (from each other or from other components) by one or more non-conductive segments of the sidewall 118. The front cover 106 may be formed, for example, using one or more of glass, a crystal (e.g., sapphire), or a transparent polymer (e.g., plastic) that enables a user to view the display 104 through the front cover 106. In some cases, a portion of the front cover 106 (e.g., a perimeter portion of the front cover 106) may be coated with an opaque ink to obscure components included within the housing 102. The rear cover 108 may be formed using the same material(s) that are used to form the sidewall 118 or the front cover 106, or may be formed using a different material or materials. In some cases, the rear cover 108 may be part of a monolithic element that also forms the sidewall 118 (or in cases where the sidewall 118 is a multi-segment sidewall, those portions of the sidewall 118 that are conductive or, alternatively, those portions of the sidewall 118 that are non-conductive). In still other embodiments, all of the exterior components of the housing 102 may be formed from a transparent material, and components within the device 100 may or may not be obscured by an opaque ink or opaque structure within the housing 102.

The front cover 106 may be mounted to the sidewall 118 to cover an opening defined by the sidewall 118 (i.e., an opening into an interior volume in which various electronic components of the device 100, including the display 104, may be positioned). The front cover 106 may be mounted to the sidewall 118 using fasteners, adhesives, seals, gaskets, or other components.

A display stack or device stack (hereafter referred to as a "stack") including the display 104 (and in some cases the front cover 106) may be attached (or abutted) to an interior surface of the front cover 106 and extend into the interior volume of the device 100. In some cases, the stack may also include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 106 (e.g., to a display surface of the device 100).

The stack may also include one or an array of sensors 116, with the sensors positioned in front of or behind, or interspersed with, the light-emitting elements of the display 104. In some cases, an array of sensors 116 may extend across an area equal in size to the area of the display 104. Alternatively, the array of sensors 116 may extend across an area that is smaller than or greater than the area of the display 104, or may be positioned entirely adjacent the display 104. Although the array of sensors 116 is shown to have a rectangular boundary, the array could alternatively have a boundary with a different shape, including, for example, an irregular shape. The array of sensors 116 may be variously configured as an ambient light sensor, a health sensor (e.g., age sensor), a touch sensor, a proximity sensor, a biometric sensor (e.g., a fingerprint sensor or facial recognition sensor), a camera, a depth sensor, an air quality sensor, and so on. The array of sensors 116 may also or alternatively function as a proximity sensor, for determining whether an object (e.g., a finger, face, or stylus) is proximate to the front cover 106. In some embodiments, the array of sensors 116 may provide the touch sensing capability (i.e., touch sensor) of the stack.

In some cases, a force sensor (or part of a force sensor system) may be positioned within the interior volume below and/or to the side of the display 104 (and in some cases within the stack). The force sensor (or force sensor system) may be triggered in response to the touch sensor detecting one or more touches on the front cover 106 (or indicating a location or locations of one or more touches on the front cover 106) and may determine an amount of force associated with each touch, or an amount of force associated with the collection of touches as a whole.

As shown primarily in FIG. 1A, the device 100 may include various other components. For example, the front of the device 100 may include one or more front-facing cameras 110 (including one or more image sensors), speakers 112, microphones, or other components 114 (e.g., audio, imaging, and/or sensing components) that are configured to transmit or receive signals to/from the device 100. In some cases, a front-facing camera 110, alone or in combination with other sensors, may be configured to operate as a bio-authentication or facial recognition sensor. Additionally or alternatively, the array of sensors 116 may be configured to operate as a front-facing camera 110, a bio-authentication sensor, or a facial recognition sensor.

The device 100 may also include buttons or other input devices positioned along the sidewall 118 and/or on a rear surface of the device 100. For example, a volume button or multipurpose button 120 may be positioned along the sidewall 118, and in some cases may extend through an aperture in the sidewall 118. The sidewall 118 may include one or more ports 122 that allow air, but not liquids, to flow into and out of the device 100. In some embodiments, one or more sensors may be positioned in or near the port(s) 122. For example, an ambient pressure sensor, ambient temperature sensor, internal/external differential pressure sensor, gas sensor, particulate matter concentration sensor, or air quality sensor may be positioned in or near a port 122.

In some embodiments, the rear surface of the device 100 may include a rear-facing camera 124. A flash or light source 126 may also be positioned along the rear of the device 100 (e.g., near the rear-facing camera). In some cases, the rear surface of the device 100 may include multiple rear-facing cameras.

In some cases, the sensor(s) 116, the front-facing camera 110, the rear-facing camera 124, and/or other sensors positioned on the front, back, or sides of the device 100 may emit or transmit signals through the housing 102 (including the front cover 106, rear cover 108, or sidewall 118) and/or receive signals or sense conditions through the housing 102. For example, in some embodiments, one or more such sensors may include a number of electromagnetic radiation emitters (e.g., visible light and/or IR emitters) and/or a number of electromagnetic radiation detectors (e.g., visible light and/or IR detectors, such as any of the electromagnetic radiation detectors described herein).

The device 100 may include circuitry (e.g., a processor and/or other components) configured to determine or extract, at least partly in response to signals received directly or indirectly from one or more of the device's sensors, biological parameters of the device's user, a status of the device 100, parameters of an environment of the device 100 (e.g., air quality), or a composition of a target or object, for example. In some embodiments, the circuitry may be configured to convey the determined or extracted parameters or statuses via an output device of the device 100. For example, the circuitry may cause the indication(s) to be displayed on the display 104, indicated via audio or haptic outputs, transmitted via a wireless communications interface or other communications interface, and so on. The circuitry may also or alternatively maintain or alter one or more settings, functions, or aspects of the device 100, including, in some cases, what is displayed on the display 104.

Figure 2:
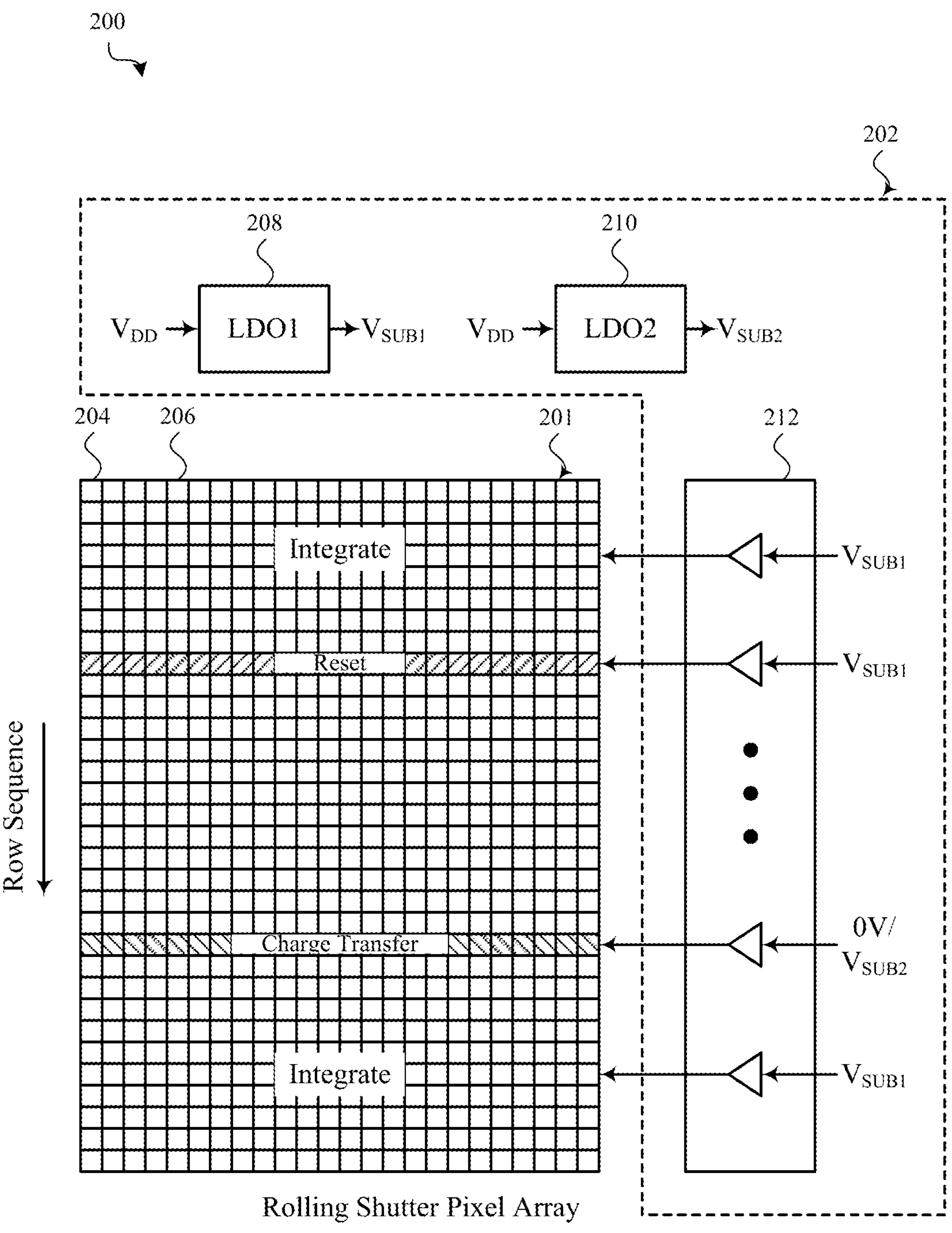
FIG. 2 shows an example rolling shutter architecture of an image sensor that employs independent dynamic substrate biasing.

FIG. 2 shows an example rolling shutter architecture of an image sensor 200 control circuit that employs independent dynamic substrate biasing. The top-level architecture shows some components of the image sensor 200, namely, a pixel array 201 and a control circuit 202. In some embodiments, the image sensor 200 may be an image sensor used in one of the cameras described with reference to FIGS. 1A and 1B (or a camera in another type of device). In some cases, the image sensor 200 may be a complementary metal-oxide semiconductor (CMOS) image sensor.

The image sensor 200 may include a set (e.g., an array 201) of pixels (e.g., pixels 204, 206, and so on). The set of pixels may be associated with a corresponding set of filter elements arranged in a filter pattern. Different subsets of pixels in the set of pixels may receive light through different types of filter elements in the set of filter elements. In some embodiments, the different types of filter elements may include red filter elements, green filter elements, and blue filter elements (i.e., RGB filter elements), which filter elements may be arranged in a Bayer color filter pattern. In some embodiments, the different types of filter elements may include other types of colored filter elements (e.g., cyan-yellow-green-magenta (CYGM) filter elements), or types of filter elements that vary by other than color (e.g., infrared (IR) or ultraviolet (UV) filter elements).

Alternatively, the set of pixels may receive unfiltered light, or the set of pixels may receive light that is filtered in the same or similar ways (e.g., filtered in a monochrome manner).

The control circuit 202 may be a singular or distributed controller (e.g., one or more control circuits) for controlling a shutter, exposure, integration time, and so on for the pixels 204, 206 of the set of pixels; for operating the set of pixels in a particular mode (e.g., a high resolution mode or a high gain mode); for performing a readout of various pixels (e.g., individual pixels or lines of pixels) of the set of pixels; and so on.

When acquiring an image using the image sensor 200, and during an image frame, each pixel 204, 206 may be cycled through different modes or states of operation. The modes may include, for example, a reset mode (a pixel reset mode), an integration mode, a charge transfer mode (a photodiode (PD) charge transfer mode), and a readout mode (a floating diffusion (FD) node readout mode). In an image sensor configured to perform a readout with correlated double sampling (CDS), the modes may include a reset mode, an integration mode, a charge storage node reset mode (e.g., an FD node reset mode), a charge storage node readout mode (e.g., an FD node readout mode for reading the charge on an FD node before charge is transferred to the FD node from a photodiode), a charge transfer mode, and a readout mode.

The different modes through which a pixel is cycled may require the application of different voltages to some or all of the pixel's transistors. Typically, the different voltages are applied to the gates, sources, and/or drains of the pixel's transistors. Some of the voltages may positively bias one or more transistors with respect to the bias of the substrate on which the transistor(s) are formed. Some of the voltages may negatively bias one or more transistors with respect to the bias of the substrate on which the transistor(s) are formed. Some of the voltages may differ from the power rail voltages of the image sensor 200. Often, one or more of the voltages may be outside the power rail voltages of the image sensor 200 (e.g., above or below). In some cases, one or more of the voltages may include a negative voltage (e.g., a voltage that is below a zero (0) volt ground.

To generate a voltage that differs from a power rail voltage, and particularly to generate a voltage that is outside the power rail voltages, a charge pump is typically employed. Charge pumps are power hungry and typically need to be enabled during a significant portion of an image frame (e.g., during a pixel's integration, charge storage node readout, charge transfer, and readout modes, as well as an initial charge pump stabilization period). Charge pumps are roadblocks to the enablement of ultra-low power (e.g., microwatt power) consumption image sensors. Charge pump removal not only reduces power consumption, but can save silicon area and reduce the need for some off-chip passive components (e.g., capacitors), thereby reducing camera module size.

The pixel array 201 may be operated with or without charge pumps. In lieu of charge pumps, the pixel array 201 may be operated using one or more LDO regulators 208, 210 that generate one or more voltages within the image sensor's power rail voltages.

One aspect of the image sensor 200 that enables it to be operated without charge pumps is that it eliminates the use of voltages outside the power rail voltages. Another aspect of the image sensor 200 that enables it to be operated without charge pumps is that it is configured to selectively alter the voltage applied to the substrate on which pixel transistors are formed (e.g., the substrate may be biased to different voltages for different modes of operation), or selectively alter the voltages applied to different electrically isolated substrate portions on which different subsets of pixel transistors are formed. In the latter case, the different electrically isolated substrate portions may be provided on the same or different substrates.

As an example, FIG. 2 shows circuitry 212 of the control circuit 202 that receives various input voltages derived from the image sensor's power rail voltages (e.g., $V_{DD}$ and GND) and/or the output(s) (e.g., $V_{SUB1}$, $V_{SUB2}$) of one or more LDO regulators 208, 210. Using the received voltages, the circuitry 212 may operate the pixel array 201 in a rolling shutter mode of operation (i.e., a mode in which pixels of the pixel array 201 are exposed to light line by line, and subsequently read out line by line) by biasing different substrate portions of the image sensor 200 to different voltages during different modes of operation of different lines of pixels. By way of example, the circuitry 212 is shown to bias substrate portions on which the transistors of lines of pixels that are currently involved in an integration mode or a reset mode reside to $V_{SUB1}$, and bias substrate portions on which the transistors of a line of pixels that is currently involved in a charge transfer mode reside to 0V or $V_{SUB2}$. As the lines of pixels cycle through different modes of operation, the circuitry 212 may at times bias the image sensor's substrate portions to different voltages.

In one set of embodiments described herein, a substrate (or substrate portion) on which a set of pixel transistors is formed may be biased to two or more different voltages, as described with reference to FIGS. 6A-9. In another set of embodiments, different electrically isolated substrate portions, on which different subsets of pixel transistors are formed, may be biased to different voltages, as described with reference to FIGS. 10-21.

Figure 3:
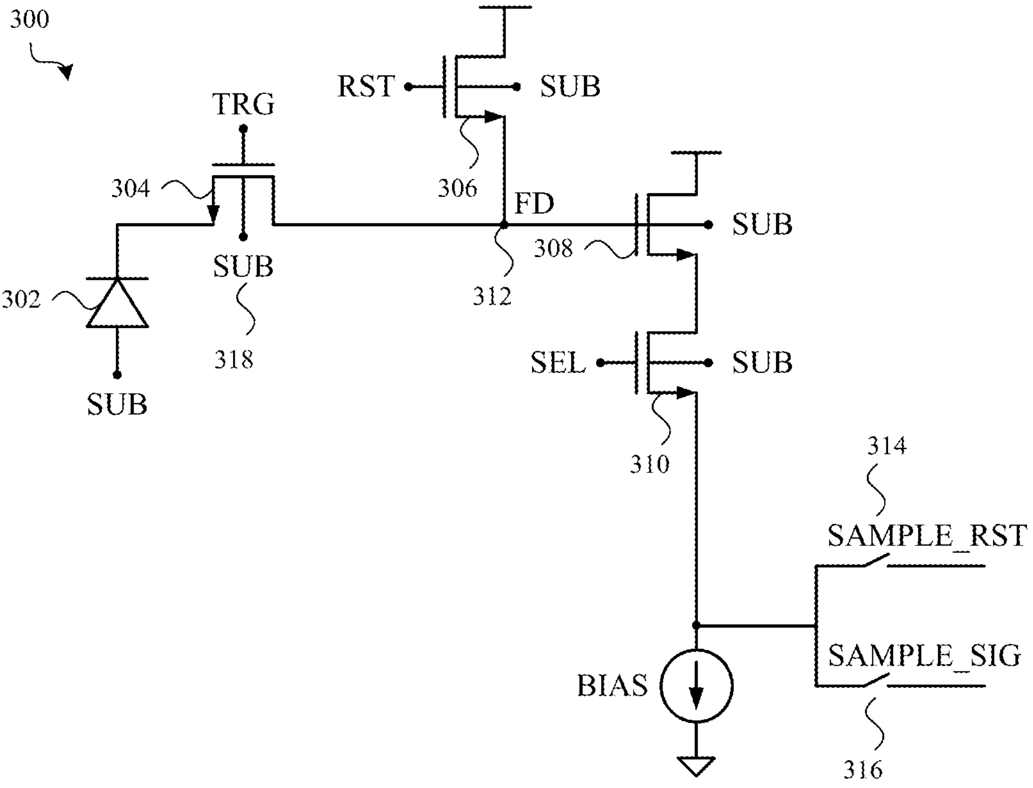
FIG. 3 shows an example schematic of a pixel, such as a pixel of one of the image sensors described with reference to FIG. 1A-1B or 2.

FIG. 3 shows an example schematic of a pixel 300, such as a pixel of one of the image sensors described with reference to FIG. 1A-1B or 2. The pixel 300 may include a photodiode 302 and a set of transistors. The set of transistors may include a charge transfer gate 304, a charge storage node reset transistor 306 (hereafter referred to as a reset transistor 306), a charge storage node readout transistor 308 (hereafter referred to as a source follower transistor 308), and a readout select transistor 310 (hereafter referred to as a select transistor 310).

The charge transfer gate 304 may be operable to selectively couple or de-couple an output of the photodiode 302 to a charge storage node 312 (e.g., an FD node), responsive to a gate signal TRG, to transfer a charge integrated by the photodiode 302 to the charge storage node 312, or to block the transfer of charge from the photodiode 302 to the charge storage node 312. The reset transistor 306 may be used to selectively reset (or bias) the charge storage node 312 and/or the photodiode 302 to a predetermined value, responsive to a gate signal RST. The source follower transistor 308 may have a gate voltage determined by the voltage of, or the value of the charge stored by, the charge storage node 312. The source follower transistor 308, in conjunction with the select transistor 310, may be used to readout the charge storage node 312 (e.g., the bias of, or the value of the charge stored by, the charge storage node) when a gate signal SEL is selectively applied to the select transistor 310.

When the pixel 300 is configured to perform a readout with CDS, and for an image frame, the photodiode 302 and charge storage node 312 may be reset via the reset transistor 306 and charge transfer gate 304; then the charge transfer gate 304 may electrically isolate the photodiode 302 from the charge storage node 312; then the photodiode 302 may integrate charge during an integration period; then the charge storage node 312 may be reset again, using the reset transistor 306; then the voltage of the charge storage node 312 may be read out through the source follower and select transistors 308, 310 and temporarily stored by closing a first readout switch 314 (SAMPLE_RST) while a second readout switch 316 (SAMPLE_SIG) remains open; then the charge transfer gate 304 may be used to transfer the charge integrated by the photodiode 302 to the charge storage node 312; and the charge stored by the charge storage node 312 may be read out through the source follower and select transistors 308, 310 and temporarily stored by closing the second readout switch 316 while the first readout switch 314 remains open. These operations may then be repeated for a next image frame.

As shown, each of the photodiode 302, transistors 304, 306, 308, 310, and charge storage node 312 may be formed or otherwise disposed on a common substrate 318 and biased by the common substrate 318. A control circuit, such as the control circuit described with reference to FIG. 2, may be operable to change the bias (SUB) applied to the substrate during some modes of operation of the pixel 300, and may enable the pixel 300 to be operated without a charge pump.

Figures 4A, 4B:
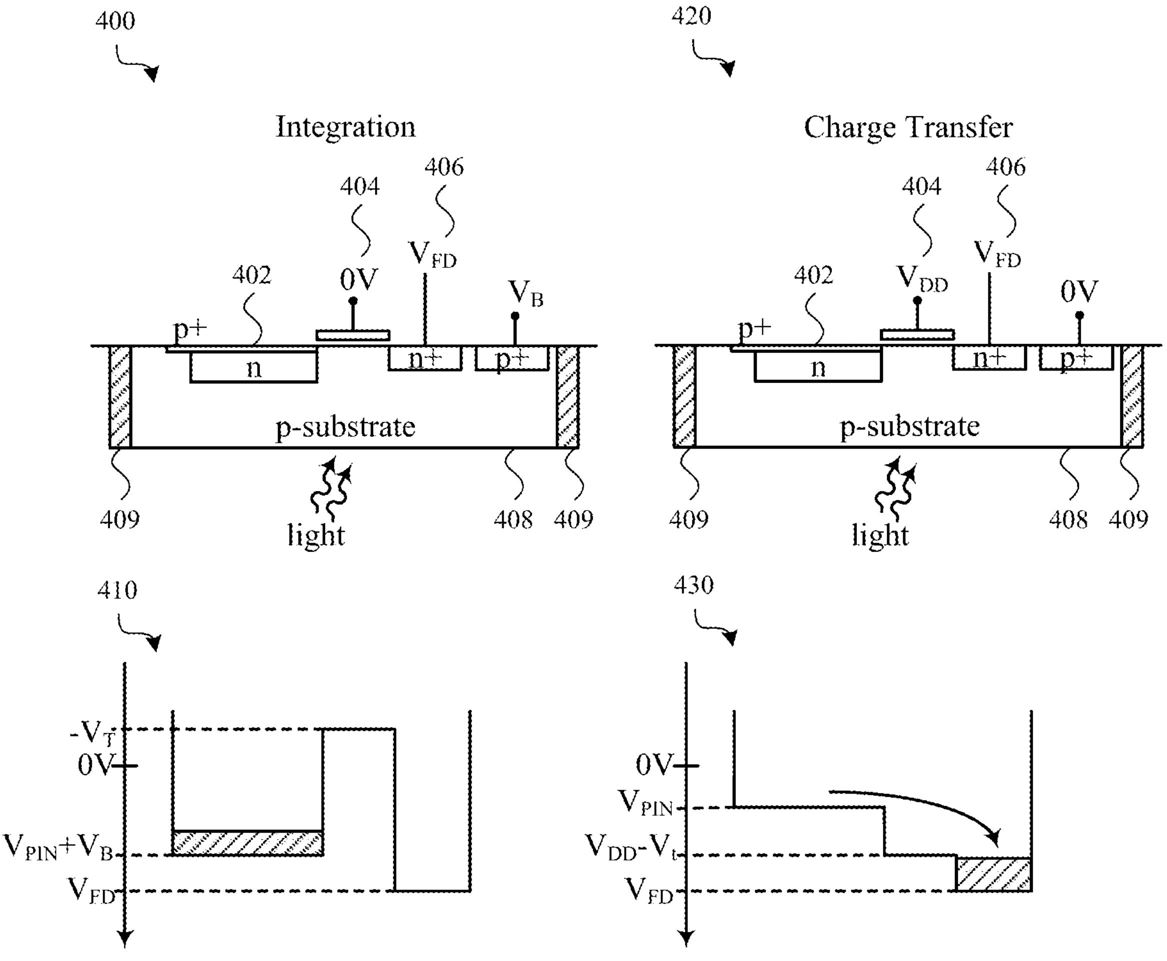
FIGS. 4A and 4B illustrate a layout cross-section and corresponding potential diagram for a photodiode, a charge transfer gate, a charge storage node, and a substrate of a pixel, during an integration mode (FIG. 4A) and a charge transfer mode (FIG. 4B), respectively.

FIGS. 4A and 4B illustrate a layout cross-section and corresponding potential diagram for a photodiode 402, a charge transfer gate 404, a charge storage node 406, and a substrate 408 of a pixel, during an integration mode 400 (FIG. 4A) and during a charge transfer mode 420 (FIG. 4B), respectively. The photodiode 402, charge transfer gate 404, charge storage node 406, and substrate 408 are examples of some of the structures shown schematically in FIG. 3. The substrate 408 (or substrate portion) may be isolated from other substrates or substrate portions by isolation 409 (e.g., deep trench isolation (DTI)).

As shown in FIG. 4A, the substrate 408 may be biased to a voltage that is greater than a voltage applied to the gate of the charge transfer gate 404 during the integration mode 400. As an example, the substrate 408 may be biased to a positive bias voltage (VB), and the TRG signal applied to the gate of the charge transfer gate 404 may be zero (0) volts (V). This negatively biases the charge transfer gate 404 and electrically isolates the photodiode 402 from the charge storage node 406.

A potential diagram 410 shows the various potentials of the photodiode 402, the gate of the charge transfer gate 404, and the charge storage node 406 during the integration mode 400. The positive substrate potential creates a deeper well for the photodiode 402 to collect more charge during the integration mode 400. The voltage $V_{PIN}$ is the pinning voltage of the photodiode 402, and the voltage $V_{FD}$ is the voltage of the charge storage node 406 (or FD node).

As shown in FIG. 4B, the substrate 408 may be biased to the lowest voltage that can be generated without using a charge pump during the charge transfer mode 420. As an example, the substrate 408 may be biased to 0V, and the TRG signal applied to the gate of the charge transfer gate 404 may be $V_{DD}$. This positively biases the charge transfer gate 404 and allows the charge integrated by the photodiode 402 during the integration mode 400 to flow into the charge storage node 406.

A potential diagram 430 shows the various potentials of the photodiode 402, the gate of the charge transfer gate 404, and the charge storage node 406 during the charge transfer mode 420. The potentials enable a steep voltage drop between the photodiode and the charge storage node 406, making it easier to transfer charge collected by the photodiode 402 during the integration mode 400 to the charge storage node 406.

Figures 5A, 5B:
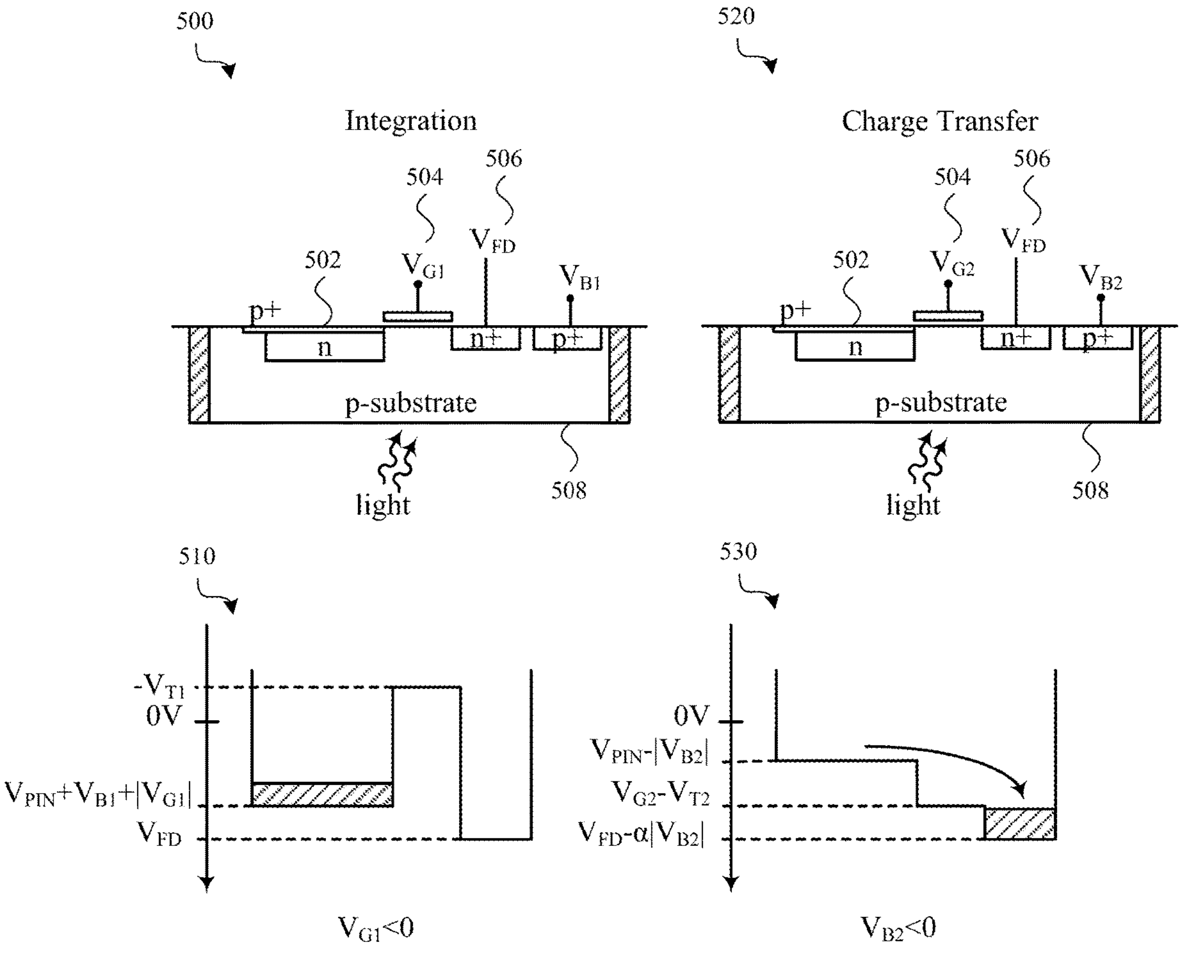
FIGS. 5A and 5B illustrate another layout cross-section and corresponding potential diagram for a photodiode, a charge transfer gate, a charge storage node, and a substrate of a pixel, during an integration mode (FIG. 5A) and a charge transfer mode (FIG. 5B), respectively.

FIGS. 5A and 5B illustrate a layout cross-section and corresponding potential diagram for a photodiode 502, a charge transfer gate 504, a charge storage node 506, and a substrate 508 of a pixel, during an integration mode 500 (FIG. 5A) and a charge transfer mode 520 (FIG. 5B), respectively. The photodiode 502, charge transfer gate 504, charge storage node 506, and substrate 508 are examples of some of the structures shown schematically in FIG. 3. The substrate 508 (or substrate portion) may be isolated from other substrates or substrate portions by isolation 509 (e.g., DTI).

As shown in FIG. 5A, the substrate 508 may be biased to a voltage that is greater than a voltage applied to the gate of the charge transfer gate 504 during the integration mode 500. As an example, the substrate 508 may be biased to a positive bias voltage ($V_{B1}$), and the TRG signal applied to the gate of the charge transfer gate 504 may be set to a negative voltage ($V_{G1}$) that is generated using a charge pump. This negatively biases the charge transfer gate 504, increasing the full well capacity of the photodiode 402 and electrically isolating the photodiode 502 from the charge storage node 506.

A potential diagram 510 shows the various potentials of the photodiode 502, the gate of the charge transfer gate 504, and the charge storage node 506 during the integration mode 500. The potentials create a large well for the photodiode to collect more charge during the integration mode 500.

As shown in FIG. 5B, the substrate 508 may be biased to a voltage that is lower than a voltage applied to the gate of the charge transfer gate 504 during the charge transfer mode 520. As an example, the substrate 508 may be biased to $V_{B2}$, and the TRG signal applied to the gate of the charge transfer gate 504 may be $V_{G2}$, with $V_{B2}<0V$. This positively biases the charge transfer gate 504 and allows the charge integrated by the photodiode 502 during the integration mode 500 to flow into the charge storage node 506.

A potential diagram 530 shows the various potentials of the photodiode 502, the gate of the charge transfer gate 504, and the charge storage node 506 during the charge transfer mode 520. The potentials enable a larger potential difference between the photodiode and the charge storage node 506, enhancing the transfer of charge collected by the photodiode 502 during the integration mode 500 to the charge storage node 506.

The scenarios presented in FIGS. 4A and 4B, on one hand, and FIGS. 5A and 5B, on the other hand, differ in that the first scenario eliminates the need for a charge pump for pixel operation. That is, the first scenario can achieve the same pixel performance, without a charge pump, as a conventional image sensor can achieve with a charge-pump. In contrast, the second scenario enhances pixel performance over what is achievable by a conventional image sensor with a charge pump by combining substrate biasing together with charge pumps. The second scenario may require the use of a charge pump, but may further reduce charge transfer time and image lag during pixel readout, further enhance pixel full well capacity, further reduce pixel dark current and defects, accommodate a larger analog-to-digital converter (ADC) range, and support a larger pixel conversion gain.

FIGS. 6A-6F and 7 show an example operation of a pixel 600, such as the pixel shown in FIG. 3. During the pixel's operation, the pixel's substrate 602 is biased to a first voltage or a second voltage during the pixel's different modes of operation. By way of example, the voltages are shown to be 0.8V and 0V. Also by way of example, the pixel's power rail voltages may be 0V and 2.8V. The 0.8V voltage may be generated from the power rail voltages using an LDO regulator. It is noted, however, that the particular voltage examples discussed with reference to FIGS. 6A-6F, 7, and other figures, are examples only and may alternatively be other voltages, separated by the same or other voltage differentials, in the positive or negative voltage domain.

FIGS. 6A-6F replace the substrate bias (SUB), transistor gate signals RST, TRG, and SEL, and switch states SAMPLE_RST and SAMPLE_SIG with actual voltages or states. FIG. 7 shows an example timing 700 of transitions between the modes of operation represented in FIGS. 6A-6F.

Figure 6A:
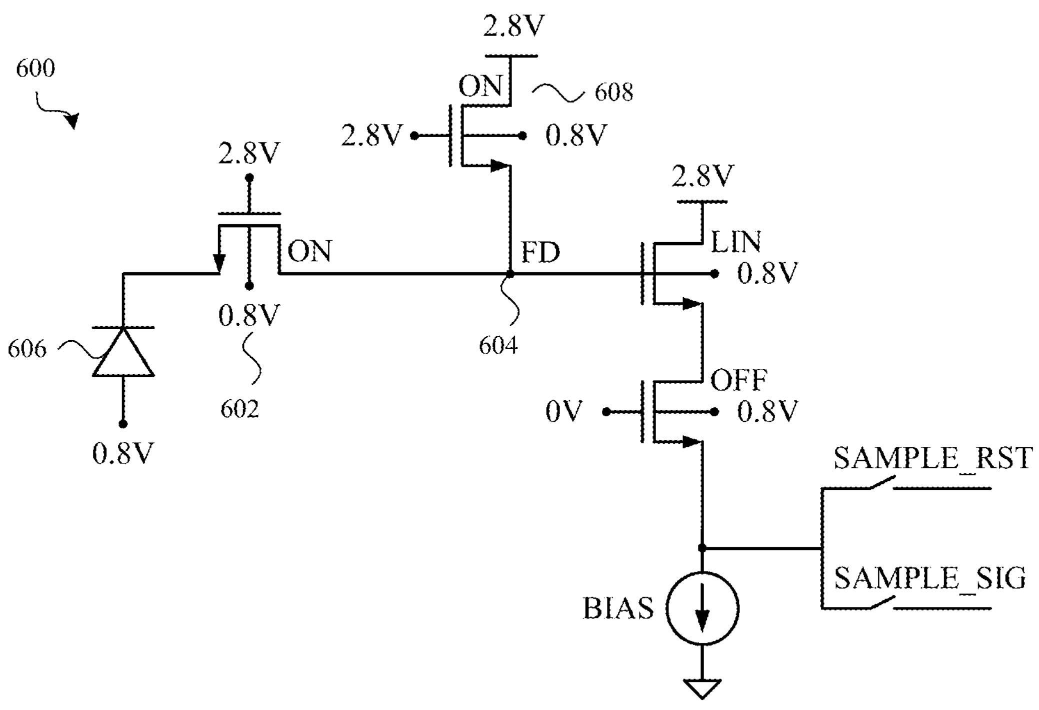
FIGS. 6A-6F and 7 show an example operation of a pixel, such as the pixel shown in FIG. 3.
Figure 7:
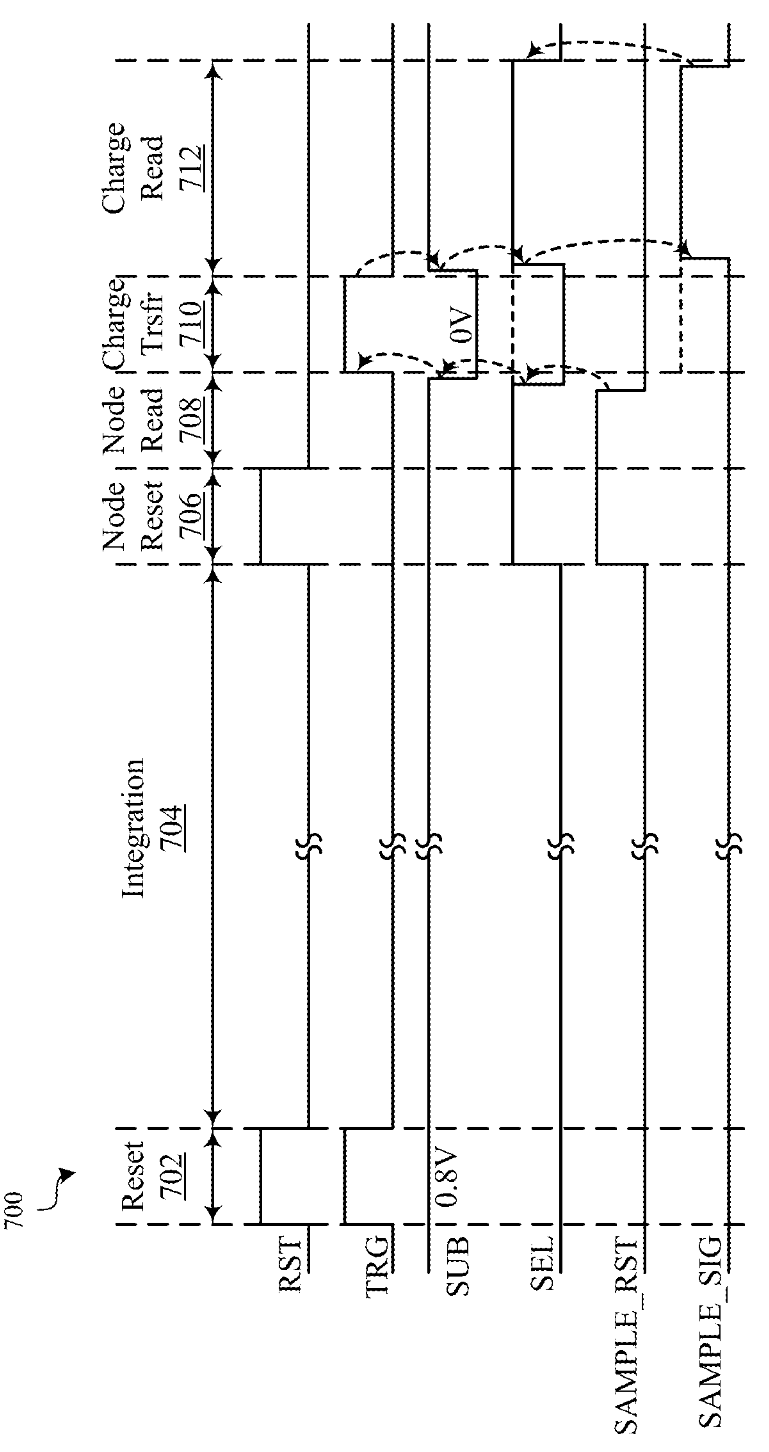

FIG. 6A shows the pixel 600 in a reset mode 702. In this mode, the substrate 602 is biased to 0.8V, the RST and TRG signals are driven to 2.8V so that the charge storage node 604 can be cleared, and the SEL signal is driven to 0V.

Figure 6B:
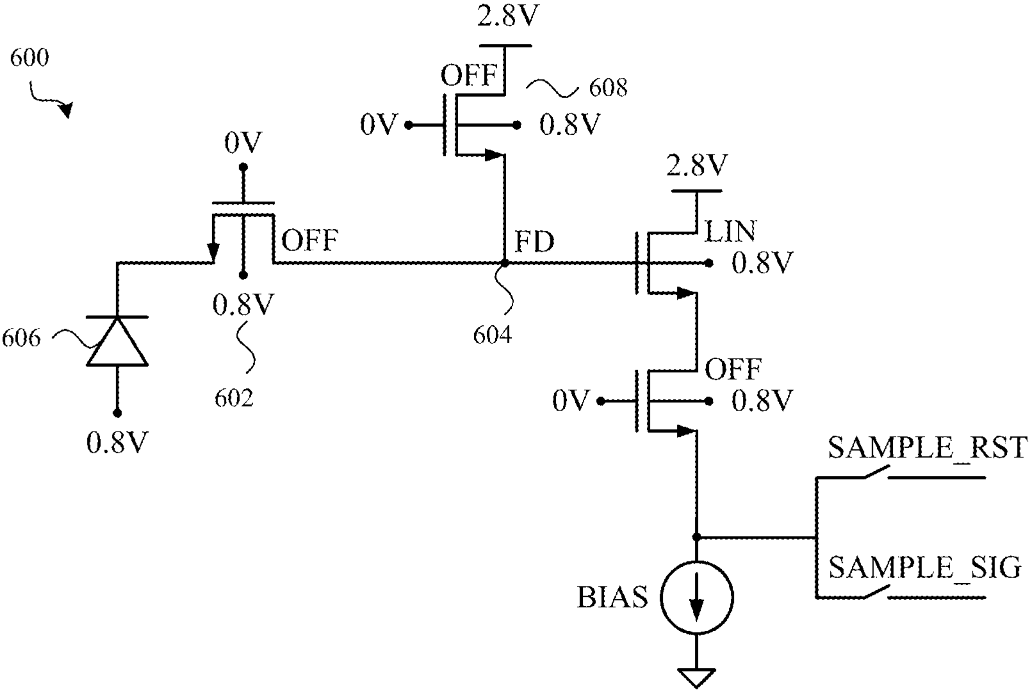

FIG. 6B shows the pixel 600 in an integration mode 704. In this mode, the substrate 602 is biased to 0.8V, and the RST, TRG, and SEL signals are driven to 0V. In this mode, a charge is integrated by the photodiode 606.

Figure 6C:
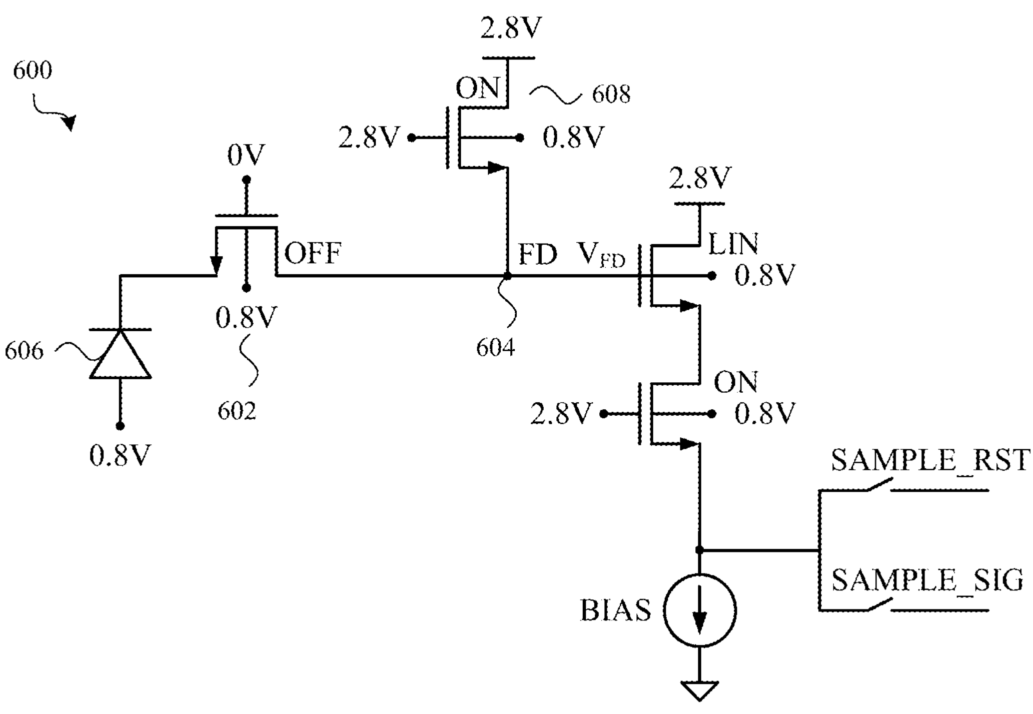

FIG. 6C shows the pixel 600 in a charge storage node reset mode 706. In this mode, the substrate 602 is biased to 0.8V, the RST and SEL signals are driven to 2.8V, and the TRG signal is driven to 0V. In this mode, the charge storage node 604 is cleared.

Figure 6D:
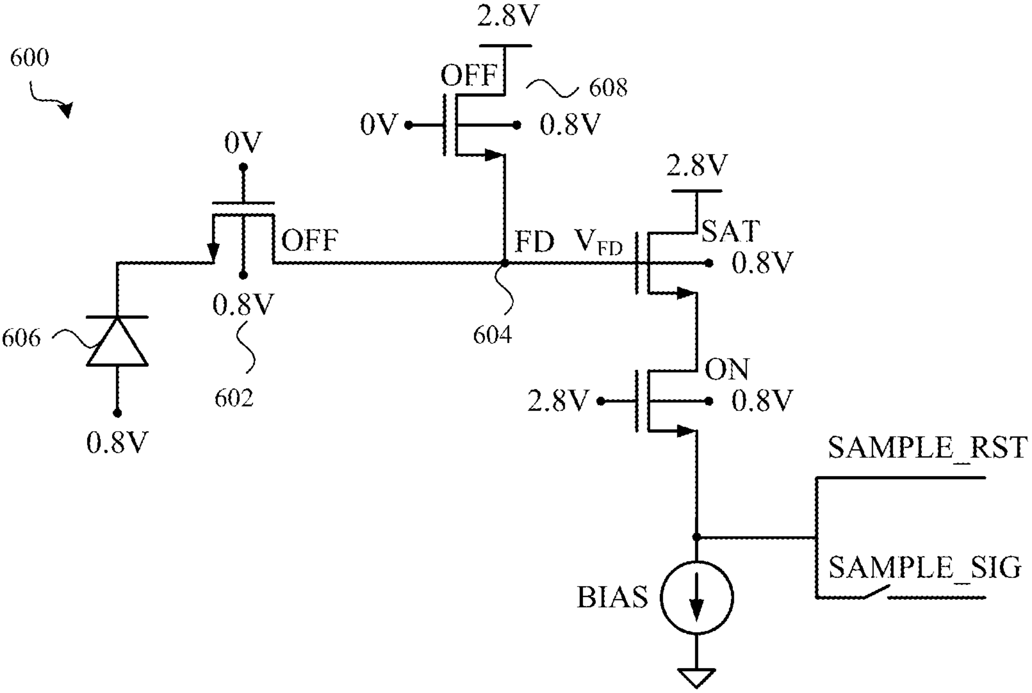

FIG. 6D shows the pixel 600 in a charge storage node readout mode 708. In this mode, the substrate 602 is biased to 0.8V, the RST and TRG signals are driven to 0V, and the SEL signal is driven to 2.8V. In this mode, a bias of the charge storage node 604 is read out and saved in a first memory location enabled by closure of the SAMPLE_RST switch.

Figure 6E:
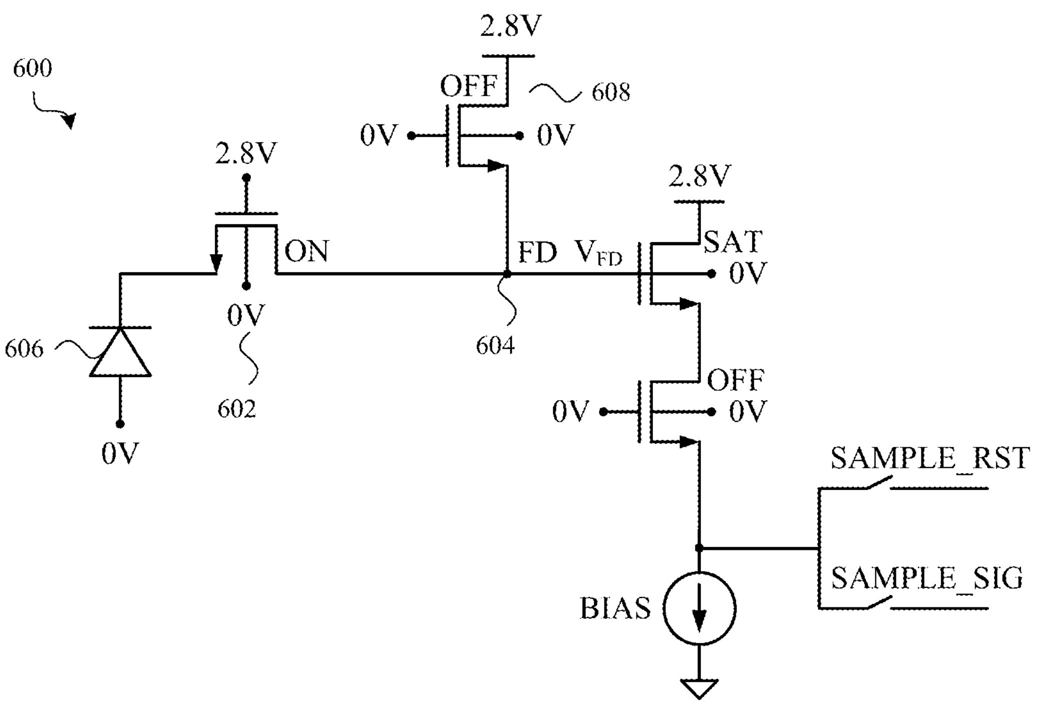

FIG. 6E shows the pixel 600 in a charge transfer mode 710. In this mode, the substrate 602 is temporarily biased to 0V, the RST and SEL signals are driven to 0V, and the TRG signal is driven to 2.8V. In this mode, the charge integrated by the photodiode 606 during the integration mode is transferred to the charge storage node 604.

Figure 6F:
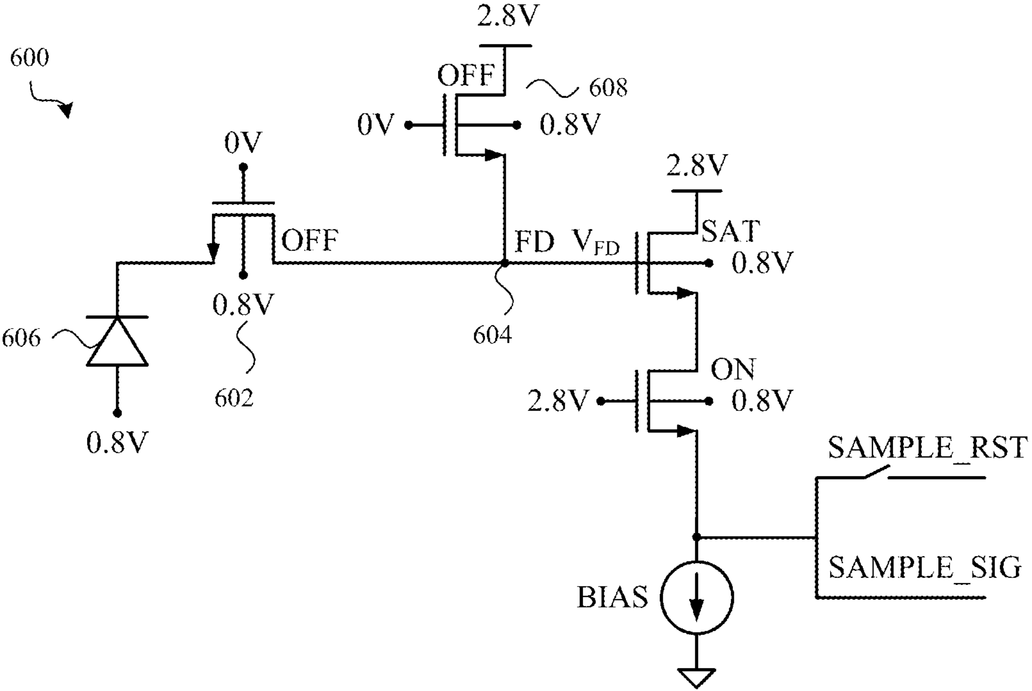

FIG. 6F shows the pixel 600 in a readout mode 712. In this mode, the substrate 602 is biased to 0.8V, the RST and TRG signals are driven to 0V, and the SEL signal is driven to 2.8V. In this mode, the value of the charge stored by the charge storage node 604 may be read out and saved in a second memory location enabled by closure of the SAMPLE_SIG switch.

The substrate 602 is therefore biased to 0.8V during all modes of operation but for the charge transfer mode 710, which enables an easier transfer of charge by the charge transfer gate 608, from the photodiode 606 to the charge transfer mode 710.

FIGS. 8A-8F and 9 show an example operation of a pixel 800, such as the pixel shown in FIG. 3. During the pixel's operation, the pixel's substrate 802 is biased to a first voltage, a second voltage, or a third voltage during the pixel's different modes of operation. By way of example, the voltages are shown to be 1.0V. 0.35V, and 0V. Also by way of example, the pixel's power rail voltages may be 0V and 2.8V. The 1.0V and 0.35V voltages may be generated from the power rail voltages using an LDO regulator.

FIGS. 8A-8F replace the substrate bias (SUB), transistor gate signals RST, TRG, and SEL, and switch states SAMPLE_RST and SAMPLE_SIG with actual voltages or states. FIG. 9 shows an example timing 900 of transitions between the modes of operation represented in FIGS. 8A-8F.

Figure 8A:
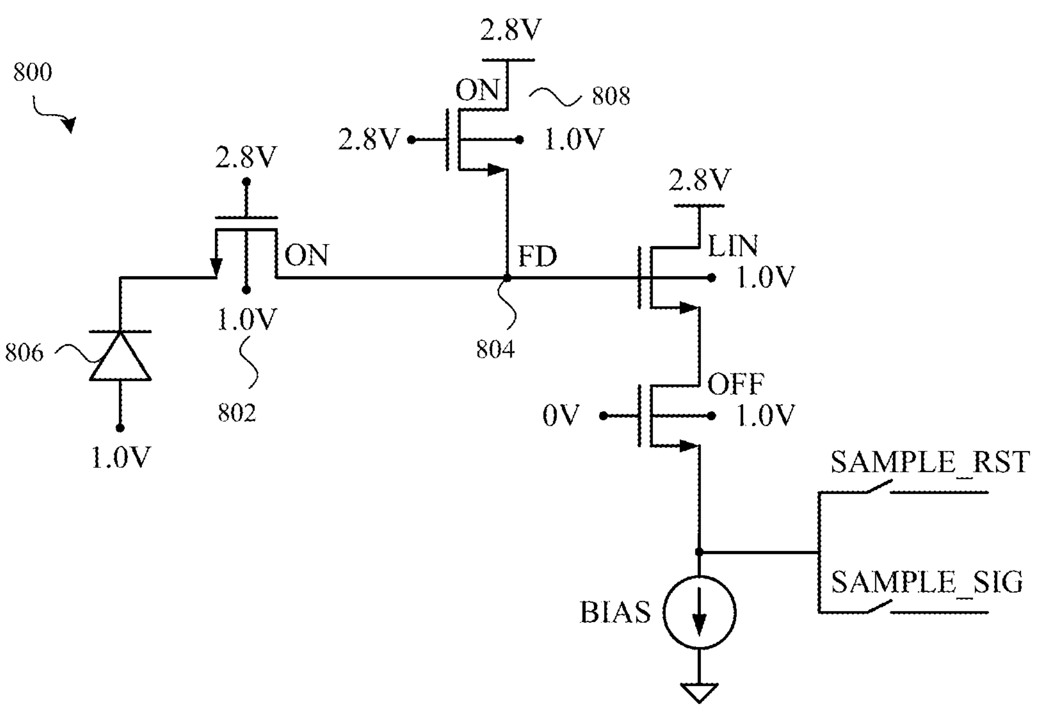
FIGS. 8A-8F and 9 show another example operation of a pixel, such as the pixel shown in FIG. 3.
Figure 9:
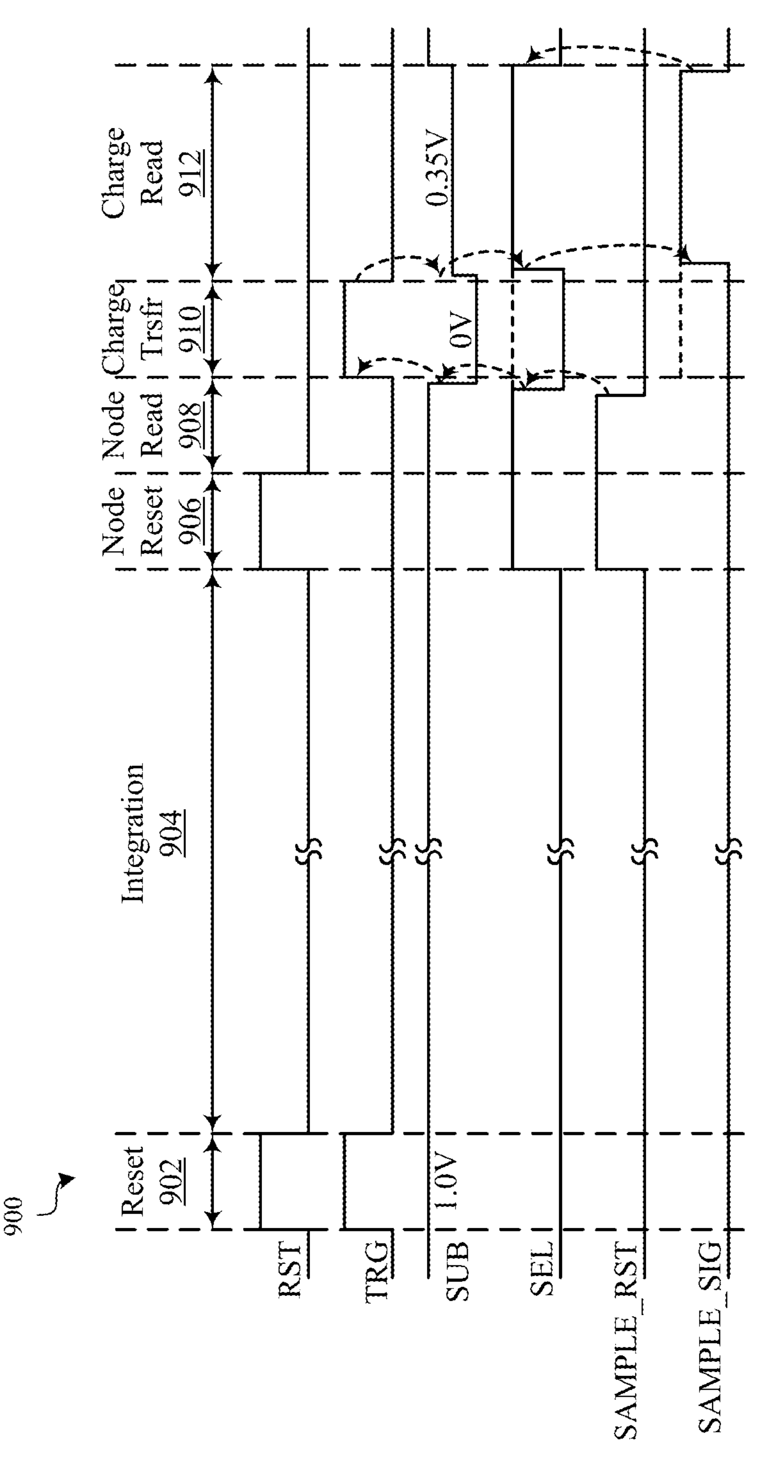

FIG. 8A shows the pixel 800 in a reset mode 902. In this mode, the substrate 802 is biased to 1.0V (a first potential), the RST and TRG signals are driven to 2.8V so that the charge storage node 804 can be cleared, and the SEL signal is driven to 0V.

Figure 8B:
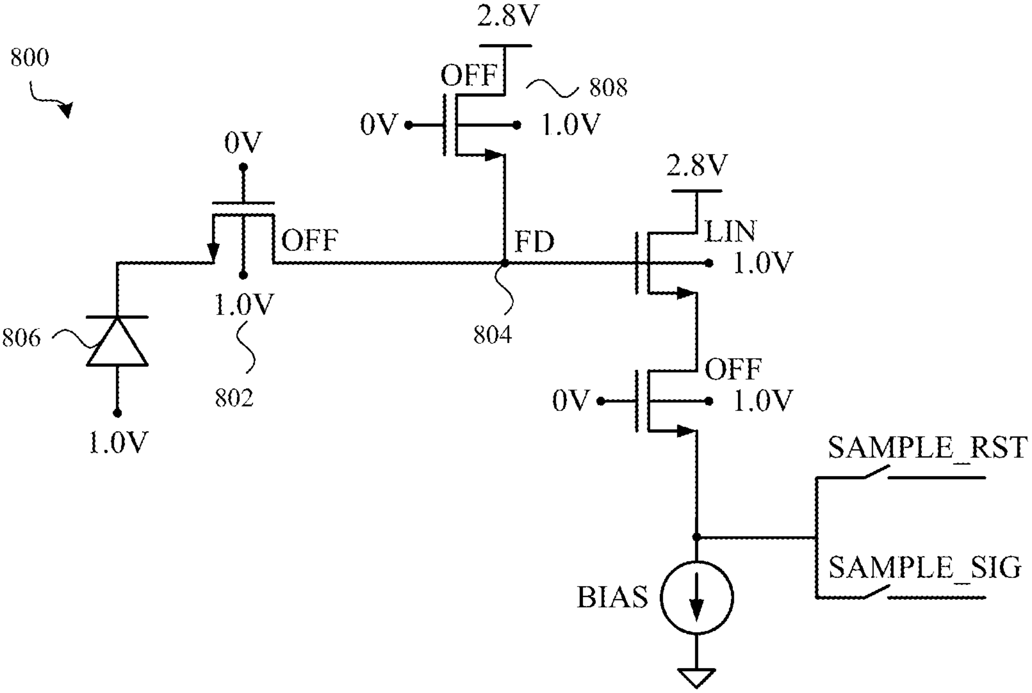

FIG. 8B shows the pixel 800 in an integration mode 904. In this mode, the substrate 802 is biased to 1.0V, and the RST, TRG, and SEL signals are driven to 0V. In this mode, a charge is integrated by the photodiode 806. Biasing the substrate at a higher voltage of 1.0V results in a higher full well capacity for the photodiode 806.

Figure 8C:
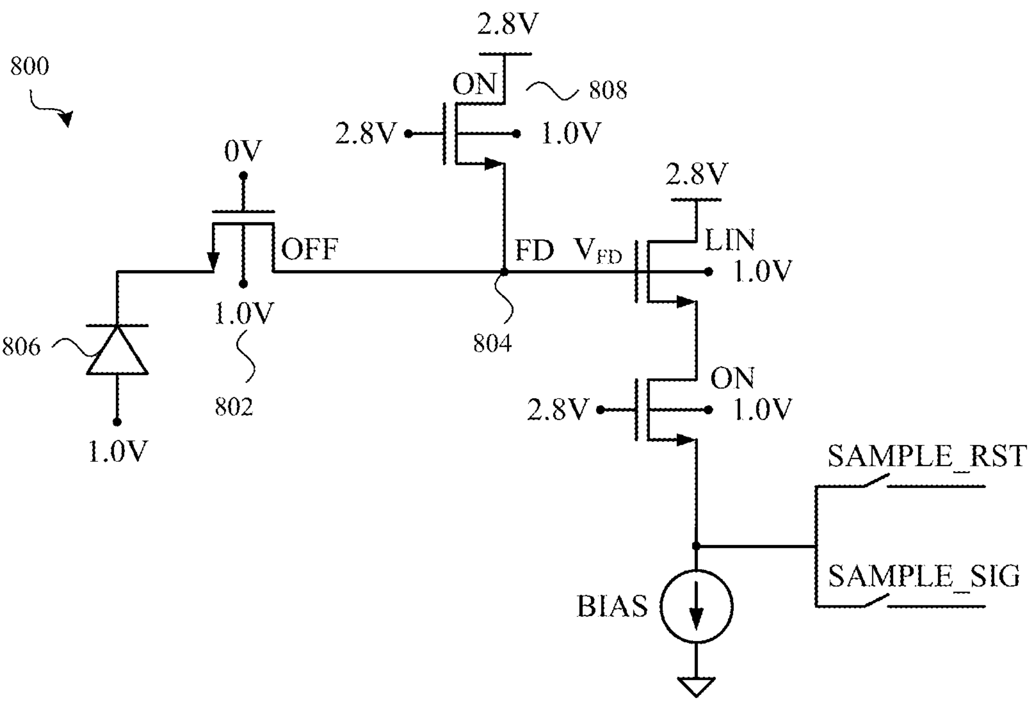

FIG. 8C shows the pixel 800 in a charge storage node reset mode 906. In this mode, the substrate 802 is biased to 1.0V, the RST and SEL signals are driven to 2.8V, and the TRG signal is driven to 0V. In this mode, the charge storage node 804 is cleared.

Figure 8D:
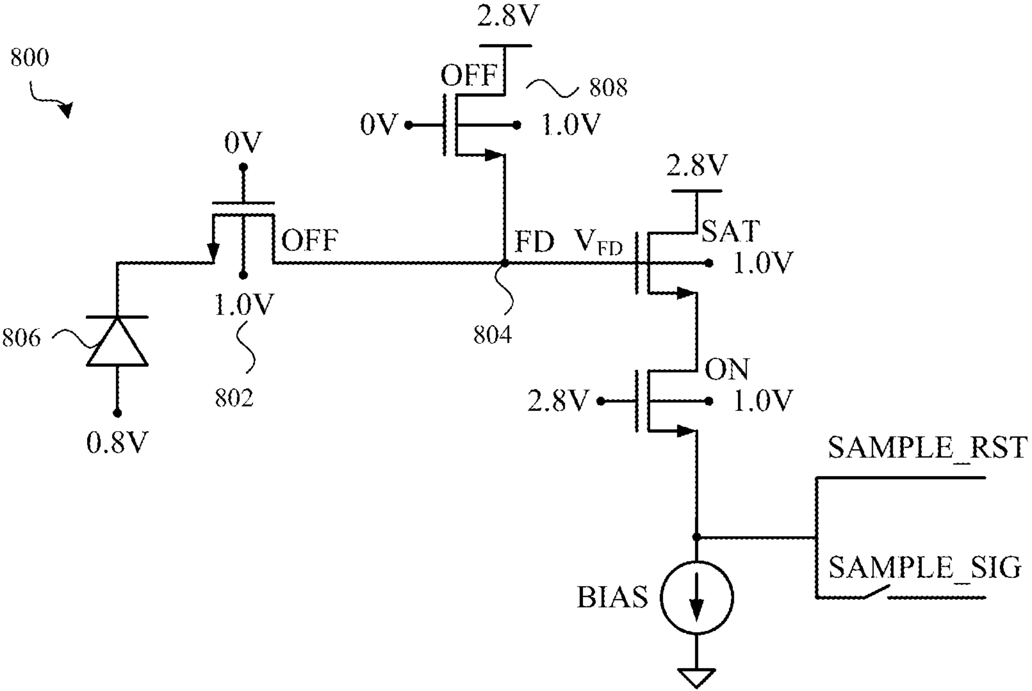

FIG. 8D shows the pixel 800 in a charge storage node readout mode 908. In this mode, the substrate 802 is biased to 1.0V, the RST and TRG signals are driven to 0V, and the SEL signal is driven to 2.8V. In this mode, a bias of the charge storage node 804 is read out and saved in a first memory location enabled by closure of the SAMPLE_RST switch.

Figure 8E:
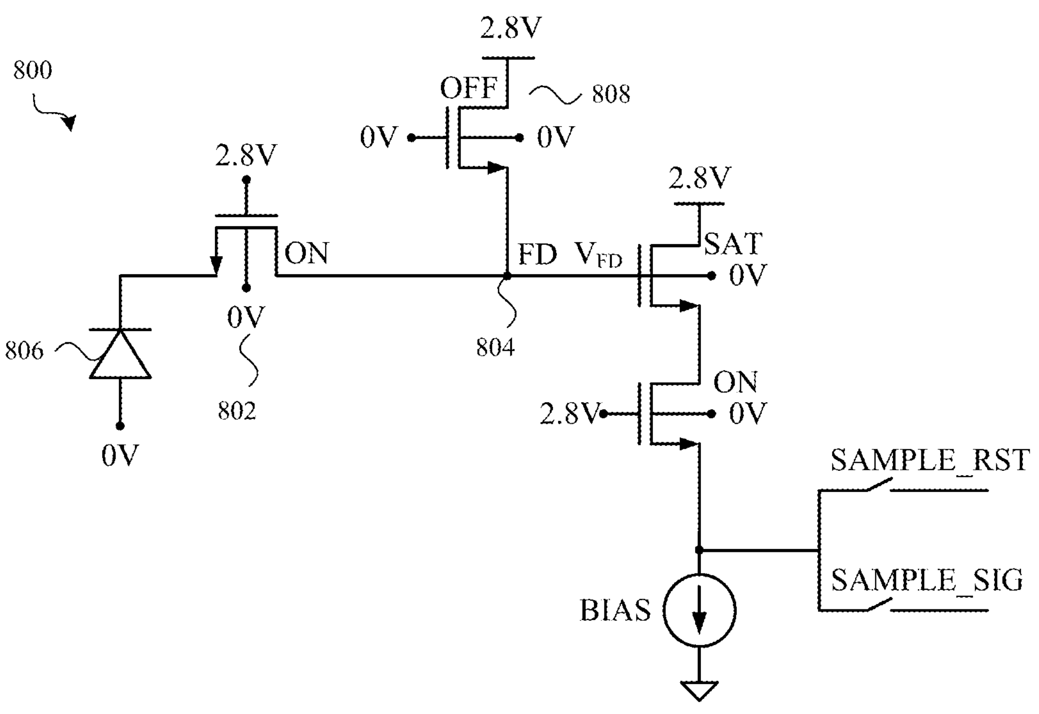

FIG. 8E shows the pixel 800 in a charge transfer mode 910. In this mode, the substrate 802 is temporarily biased to 0V (a second potential), the RST and SEL signals are driven to 0V, and the TRG signal is driven to 2.8V. In this mode, the charge integrated by the photodiode 806 during the integration mode is transferred to the charge storage node 804.

Figure 8F:
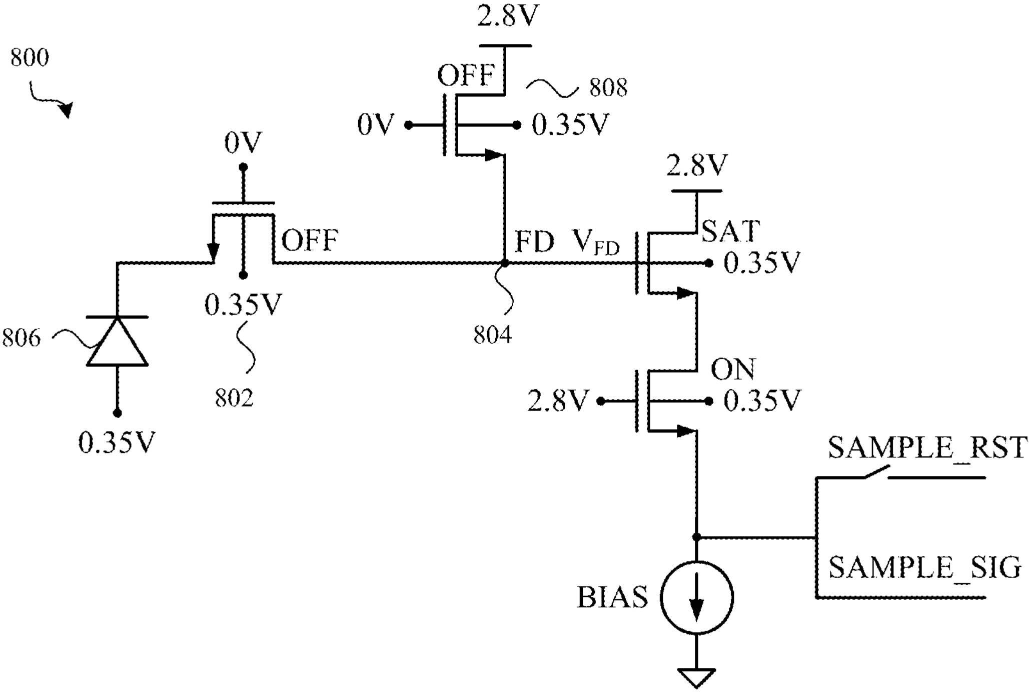

FIG. 8F shows the pixel 800 in a readout mode 912. In this mode, the substrate 802 is biased to 0.35V (a third potential), the RST and TRG signals are driven to 0V, and the SEL signal is driven to 2.8V. In this mode, the value of the charge stored by the charge storage node 804 may be read out and saved in a second memory location enabled by closure of the SAMPLE_SIG switch.

The substrate 802 is therefore biased to 1.0V during most modes of operation, to 0V during the charge transfer mode 910, and to 0.35V during the readout mode 912. The bias to 0V, facilitates easier charge transfer from the photodiode 806 to the charge storage node 804. The 0.35V bias may adjust the start value of an ADC ramp used for readout and ensure that all voltages are within an acceptable range for ADC operation. In some embodiments, digital black level correction may be employed to cancel temperature drift.

Although FIG. 9 illustrates the dynamic biasing of a substrate to three different potentials, a substrate (or substrate portion) can alternatively be biased to more than three different potentials.

Figure 10:
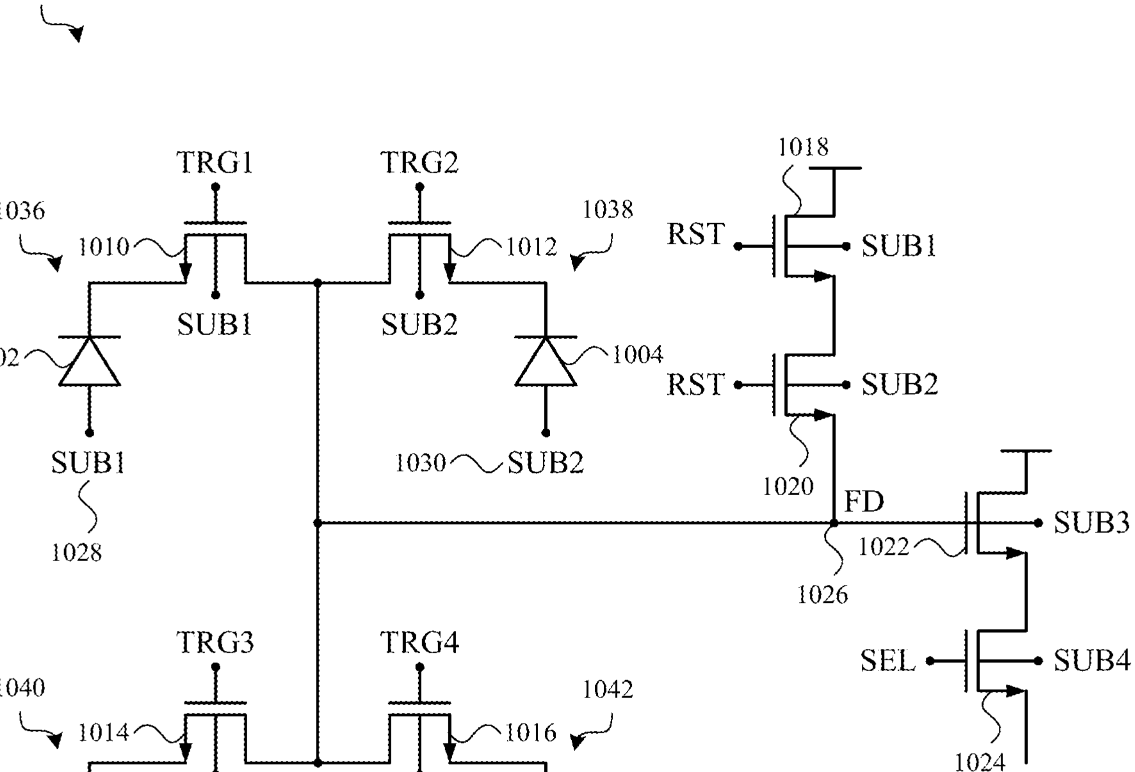
FIG. 10 shows an example illustration of how dynamic substrate biasing can be employed for pixels that share readout transistors.

FIG. 10 shows an illustration of how dynamic substrate biasing can be employed for pixels that share readout transistors. In particular, FIG. 10 shows a schematic of a set of pixels 1000, such as a set of pixels of one of the image sensors described with reference to FIG. 1A-1B or 2. The set of pixels 1000 may include a set of photodiodes 1002, 1004, 1006, 1008 and a set of transistors. The set of transistors may include a set of charge transfer gates 1010, 1012, 1014, 1016 and a set of transistors that are shared by the set of pixels 1000. The shared transistors may include one or two charge storage node reset transistors 1018, 1020 (hereafter referred to as reset transistors 1018, 1020), a charge storage node readout transistor 1022 (hereafter referred to as a source follower transistor 1022), and a readout select transistor 1024 (hereafter referred to as a select transistor 1024). The shared transistors may at times be referred to herein as first, second, third, and fourth transistors.

Each charge transfer gate 1010, 1012, 1014, or 1016 may be operable to selectively couple or de-couple an output of a respective photodiode 1002, 1004, 1006, 1008 to a shared charge storage node 1026 (e.g., an FD node), responsive to a respective gate signal TRG1, TRG2, TRG3, TRG4, to transfer a charge integrated by a photodiode 1002, 1004, 1006, 1008 to the charge storage node 1026, or to block the transfer of charge from a photodiode 1002, 1004, 1006, or 1008 to the charge storage node 1026. The reset transistor(s) 1018, 1020 may be used to selectively reset (or bias) the charge storage node 1026 and/or one or more of the photodiodes 1002, 1004, 1006, 1008 to a predetermined value, responsive to a gate signal RST. The source follower transistor 1022 may have a gate voltage determined by the bias of, or the value of the charge stored by, the charge storage node 1026. The source follower transistor 1022, in conjunction with the select transistor 1024, may be used to readout the charge storage node 1026 (e.g., the bias of, or the value of the charge stored by, the charge storage node) when a gate signal SEL is selectively applied to the select transistor 1024.

The pixels of the set of pixels 1000 may integrate charge at the same or different times, and may be read out individually (e.g., in a high resolution mode) or in combination (e.g., in pairs or all at once, in a summed charge mode). The pixels of the set of pixels 1000 may be configured to perform a readout with or without CDS, as described with reference to FIG. 3.

As shown, each of the photodiodes 1002, 1004, 1006, 1008, transistors 1010, 1012, 1014, 1016, 1018, 1020, 1022, 1024, and charge storage node 1026 may be formed or otherwise disposed on one of a set of substrate portions 1028, 1030, 1032, 1034. Changing the bias (SUB1, SUB2, SUB3, or SUB4) applied to one or more of the substrate portions 1028, 1030, 1032, 1034, during some modes of operation of the various pixels 1036, 1038, 1040, 1042 of the set of pixels 1000, may enable the set of pixels 1000 to be operated without a charge pump.

When the set of pixels 1000 is configured to be readout with CDS, and for an image frame, the photodiodes 1002, 1004, 1006, 1008 and charge storage node 1026 may be reset via the reset transistors 1018, 1020 and charge transfer gates 1010, 1012, 1014, 1016; the charge transfer gates 1010, 1012, 1014, 1016 may then electrically isolate the photodiodes 1002, 1004, 1006, 1008 from the charge storage node 1026; the photodiodes 1002, 1004, 1006, 1008 may then integrate charge during a shared integration period; the charge storage node 1026 may then be reset again, using the reset transistors 1018, 1020; the bias of the charge storage node 1026 may then be read out through the source follower and select transistors 1022, 1024 and temporarily stored by closing a first readout switch (e.g., SAMPLE_RST, as described with reference to FIG. 3) while a second or additional readout switch(es) (e.g., SAMPLE_SIG and/or other readout switches) remain open; one or more of the charge transfer gates 1010, 1012, 1014, 1016 may then be used to transfer the charge(s) integrated by one or more of the photodiodes 1002, 1004, 1006, 1008 to the charge storage node 1026; and the charge stored by the charge storage node 1026 may then be read out through the source follower and select transistors 1022, 1024 and temporarily stored by closing a second or additional readout switch while the first readout switch remains open (e.g., as described with reference to FIG. 3). These operations may then be repeated for a next image frame. Or, in the case of reading out charges from individual photodiodes 1002, 1004, 1006, 1008 and/or different pairs of photodiodes, some of the above operations may be repeated for different charge readouts. For example, the operations may be repeated beginning from the second reset of the charge storage node 1026, or beginning from the transfer of charge from one or more photodiodes to the charge storage node 1026.

Figure 11:
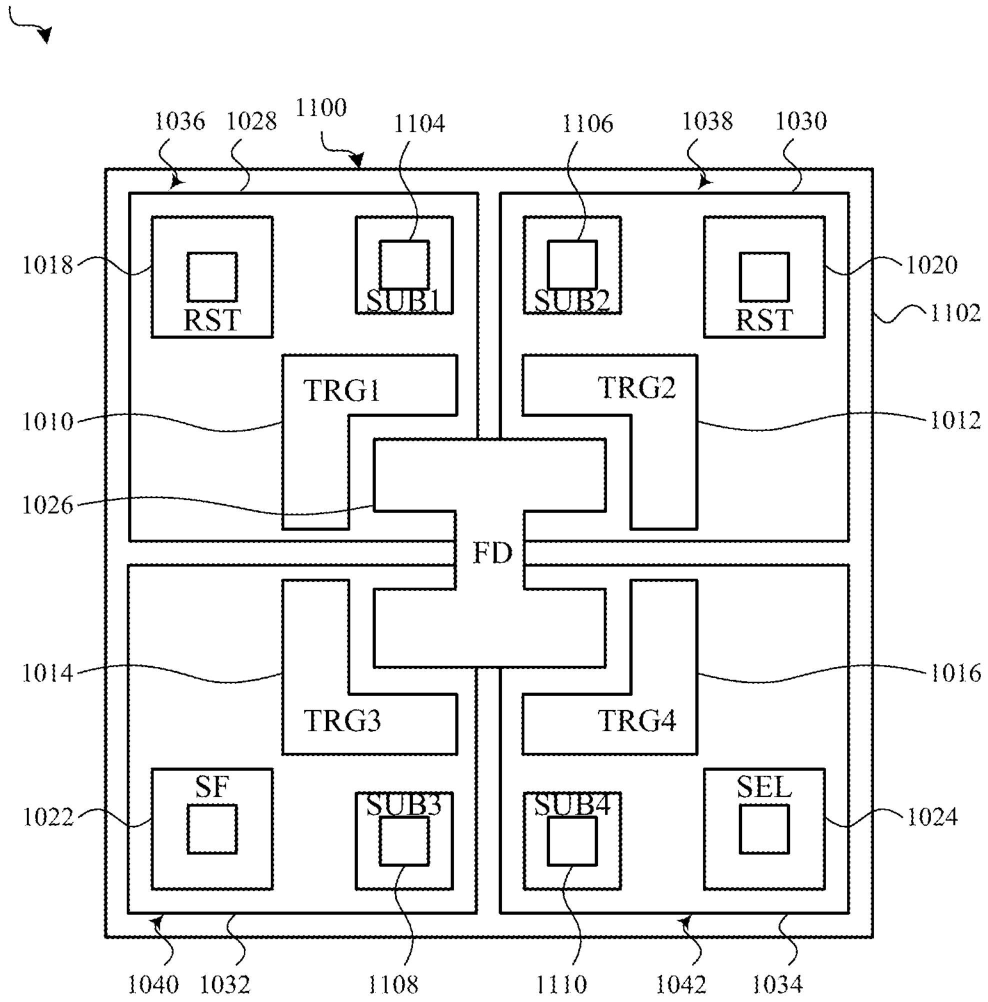
FIG. 11 shows a layout view of the set of pixels described with reference to FIG. 10, on a semiconductor substrate including a set of substrate portions.

FIG. 11 shows a layout view of the set of pixels 1000 described with reference to FIG. 10, on a semiconductor substrate 1100 including the set of substrate portions 1028, 1030, 1032, 1034. Each substrate portion 1028, 1030, 1032, 1034 may be electrically isolated from other substrate portions. For example, each substrate portion may be electrically isolated from each other substrate portion of the set of substrate portions 1028, 1030, 1032, 1034. In some embodiments, the substrate portions 1028, 1030, 1032, 1034 may be electrically isolated from each other by oxide walls (e.g., deep trench isolation (DTI) 1102). In other embodiments, the substrate portions 1028, 1030, 1032, 1034 may be electrically isolated from each other by DTI in combination with other types of isolation (e.g., shallow trench isolation (STI)) and/or combinations of different types of isolation structures, such as other types of oxide walls.

A different pixel 1036, 1038, 1040, 1042 in the set of pixels 1000 may be associated with (e.g., disposed on or in, and biased by) each substrate portion 1028, 1030, 1032, 1034. Each pixel 1036, 1038, 1040, 1042 may include a respective photodiode 1002, 1004, 1006, 1008 of the set of photodiodes (not shown in FIG. 11), and a respective charge transfer gate 1010, 1012, 1014, 1016 of the set of charge transfer gates. Each charge transfer gate may be operable to selectively connect a respective photodiode to the charge storage node 1026.

The set of transistors that is shared by the set of pixels 1000 may be distributed among, disposed on, and biased by the different substrate portions 1028, 1030, 1032, 1034. For example, the reset transistor 1018 may be disposed on a first substrate portion 1028 associated with a first pixel 1036, the second reset transistor 1020 may be disposed on a second substrate portion 1030 associated with a second pixel 1038, the source follower transistor 1022 may be disposed on a third substrate portion 1032 associated with a third pixel 1040, and the select transistor 1024 may be disposed on a fourth substrate portion 1034 associated with a fourth pixel 1042. Although the second reset transistor 1020 is optional, including the second reset transistor 1020 improves the leakage current performance of the reset path.

As shown, each of the photodiodes 1002, 1004, 1006, 1008, transistors 1010, 1012, 1014, 1016, 1018, 1020, 1022, 1024, and charge storage node 1026 may be biased by applying a bias signal SUB1, SUB2, SUB3, or SUB4 to a respective bias contact 1104, 1106, 1108, 1110 on a respective substrate portion 1028, 1030, 1032, 1034. A control circuit, such as the control circuit described with reference to FIG. 2, may be operable to change the bias (SUB1, SUB2, SUB3, or SUB4) applied to one or more of the substrate portions 1028, 1030, 1032, 1034 during some modes of operation of the pixels 1036, 1038, 1040, 1042 (e.g., dynamically bias each substrate portion independently of each other substrate portion), and may enable the set of pixels 1000 to be operated without a charge pump.

When reading out a charge for each of the pixels 1036, 1038, 1040, 1042 (e.g., in a high resolution mode), the biases SUB1, SUB2, SUB3, and SUB4 may be sequentially pulsed to ground, or to a different voltage, as charge transfer and readout for the different pixels 1036, 1038, 1040, 1042 is performed sequentially using the shared charge storage node 1026. When reading out a summed charge for all of the pixels 1036, 1038, 1040, 1042 (e.g., in a binned charge mode), the biases SUB1, SUB2, SUB3, and SUB4 may be pulsed to ground or a different voltage at the same time, as charge transfer and readout for the different pixels 1036, 1038, 1040, 1042 is performed in one operation using the shared charge storage node 1026. In either readout mode, a stacked reset may be used to avoid excessive leakage (e.g., if SUB1 or SUB2 is grounded during charge transfer).

In some embodiments, a control circuit for the set of pixels 1000 may be operable in a first mode (e.g., a high resolution mode) or a second mode (e.g., a binned charge mode). In the first mode, all substrate portions 1028, 1030, 1032, 1034 of the set of substrate portions may be biased to a first potential or one substrate portion 1028, 1030, 1032, or 1034 of the set of substrate portions may be biased to the second potential while other substrate portions of the set of substrate portions are biased to the first potential. In the second mode, all substrate portions 1028, 1030, 1032, 1034 of the set of substrate portions may be biased to a first potential or a second potential.

Figure 12:
FIG. 12 shows another example schematic of a set of pixels, such as a set of pixels of one of the image sensors described with reference to FIG. 1A-1B or 2.
Figure 12:
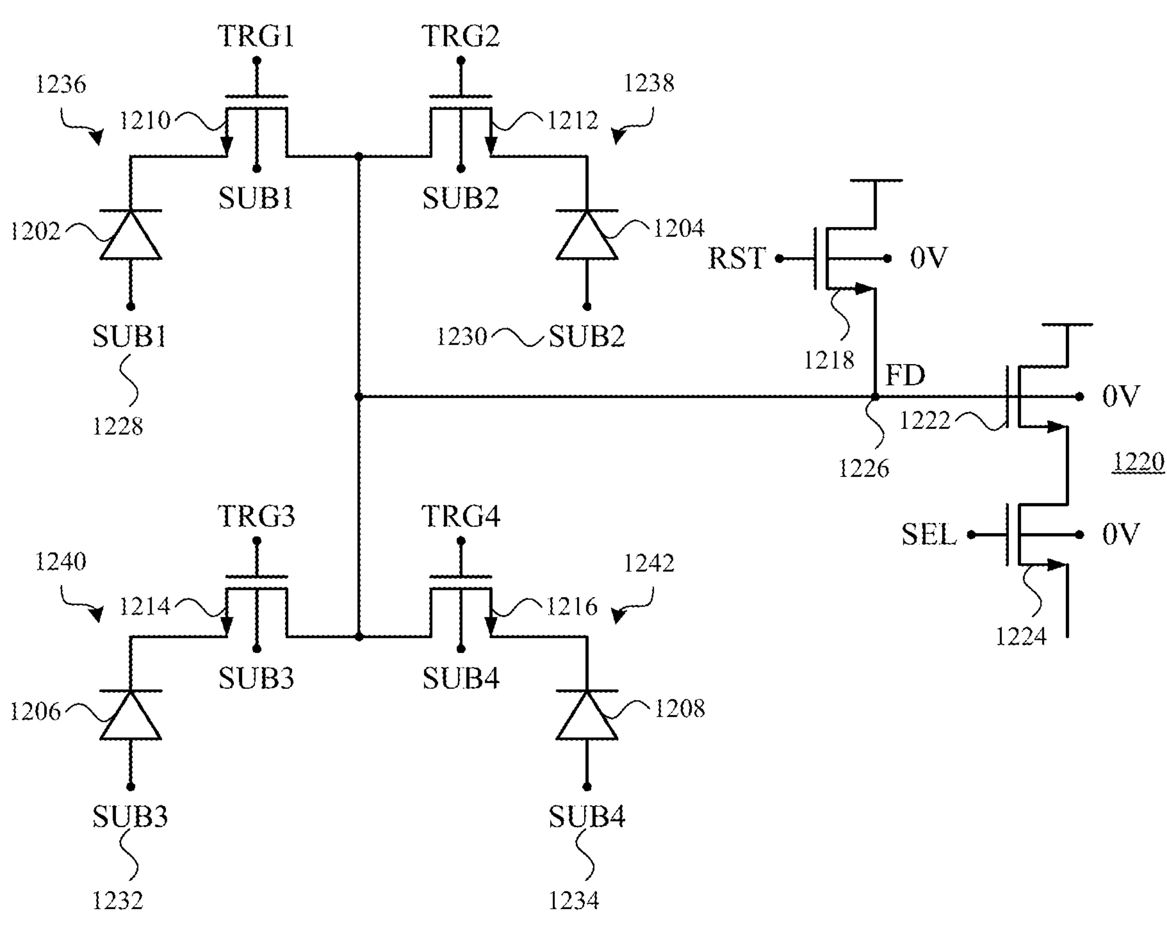

FIG. 12 shows another example schematic of a set of pixels 1200, such as a set of pixels of one of the image sensors described with reference to FIG. 1A-1B or 2. The set of pixels 1200 may include a set of PDs 1202, 1204, 1206, 1208 and a set of charge transfer gates 1210, 1212, 1214, 1216.

Each charge transfer gate 1210, 1212, 1214, or 1216 may be operable to selectively couple or de-couple an output of a respective photodiode 1202, 1204, 1206, or 1208 to a shared charge storage node 1226 (e.g., an FD node), responsive to a respective gate signal TRG1, TRG2, TRG3, or TRG4, to transfer a charge integrated by a photodiode 1202, 1204, 1206, or 1208 to the charge storage node 1226, or to block the transfer of charge from a photodiode 1202, 1204, 1206, or 1208 to the charge storage node 1226.

The set of pixels 1200 may be associated with a set of transistors that is shared by the set of pixels 1200. The shared transistors may include a charge storage node reset transistor 1218 (hereafter referred to as reset transistor 1218), a charge storage node readout transistor 1222 (hereafter referred to as a source follower transistor 1222), and a readout select transistor 1224 (hereafter referred to as a select transistor 1224). The shared transistors may at times be referred to herein as first, second, and third transistors.

The reset transistor 1218 may be used to selectively reset (or bias) the charge storage node 1226 and/or one or more of the photodiodes 1202, 1204, 1206, 1208 to a predetermined value, responsive to a gate signal RST. The source follower transistor 1222 may have a gate voltage determined by the bias of, or the value of the charge stored by, the charge storage node 1226. The source follower transistor 1222, in conjunction with the select transistor 1224, may be used to readout the charge storage node 1226 (e.g., the bias of, or the value of the charge stored by, the charge storage node) when a gate signal SEL is selectively applied to the select transistor 1224.

The pixels of the set of pixels 1200 may integrate charge at the same or different times, and may be read out individually (e.g., in a high resolution mode) or in combination (e.g., in pairs or all at once, in a summed charge mode). The pixels of the set of pixels 1200 may be configured to perform a readout with or without CDS, as described with reference to FIG. 3.

As shown, each of the photodiodes 1202, 1204, 1206, 1208, transistors 1210, 1212, 1214, 1216, 1218, 1222, 1224, and charge storage node 1226 may be formed or otherwise disposed on one of a set of substrate portions 1220, 1228, 1230, 1232, 1234. In particular, a first photodiode 1202 and first charge transfer gate 1210 may be disposed on a first substrate portion 1220; a second photodiode 1204 and second charge transfer gate 1212 may be disposed on a second substrate portion 1228; a third photodiode 1206 and third charge transfer gate 1214 may be disposed on a third substrate portion 1230; a fourth photodiode 1208 and fourth transfer gate 1216 may be disposed on a fourth substrate portion 1232; and the shared set of transistors 1218, 1222, 1224 may be disposed on a fifth substrate portion 1234.

In some embodiments, the fifth substrate portion 1220 may be biased to a fixed potential (e.g., 0 V), but the bias (SUB1, SUB2, SUB3, or SUB4) applied to one or more of the other substrate portions 1228, 1230, 1232, 1234 may be changed during some modes of operation of the pixels 1236, 1238, 1240, 1242 of the set of pixels 1200, thereby enabling the set of pixels 1200 to be operated without a charge pump. Separating the reset and readout transistors 1218, 1222, 1224 into a separate substrate portion 1220 decouples them from the photodiode substrate portions 1228, 1230, 1232, 1234. This removes any voltage range limitation placed on ADC readout and allows ADC input range optimization by independent voltage setting for the fifth substrate portion 1220.

When the set of pixels 1200 is configured to be readout with CDS, and for an image frame, the photodiodes 1202, 1204, 1206, 1208 and charge storage node 1226 may be reset via the reset transistor 1218 and charge transfer gates 1210, 1012, 1014, 1016; the charge transfer gates 1210, 1212, 1214, 1216 may then electrically isolate the photodiodes 1202, 1204, 1206, 1208 from the charge storage node 1226; the photodiodes 1202, 1204, 1206, 1208 may then integrate charge during a shared integration period; the charge storage node 1226 may then be reset again, using the reset transistor 1218; the bias of the charge storage node 1226 may then be read out through the source follower and select transistors 1222, 1224 and temporarily stored by closing a first readout switch (e.g., SAMPLE_RST, as described with reference to FIG. 3) while a second or additional readout switch(es) (e.g., SAMPLE_SIG and/or other readout switches) remain open; one or more of the charge transfer gates 1210, 1212, 1214, 1216 may then be used to transfer the charge(s) integrated by one or more of the photodiodes 1202, 1204, 1206, 1208 to the charge storage node 1226; and the charge stored by the charge storage node 1226 may then be read out through the source follower and select transistors 1222, 1224 and temporarily stored by closing a second or additional readout switch while the first readout switch remains open (e.g., as described with reference to FIG. 3). These operations may then be repeated for a next image frame. Or, in the case of reading out charges from individual photodiodes 1202, 1204, 1206, 1208 and/or different pairs of photodiodes, some of the above operations may be repeated for different charge readouts. For example, the operations may be repeated beginning from the second reset of the charge storage node 1226, or beginning from the transfer of charge from one or more photodiodes to the charge storage node 1226.

Figure 13:
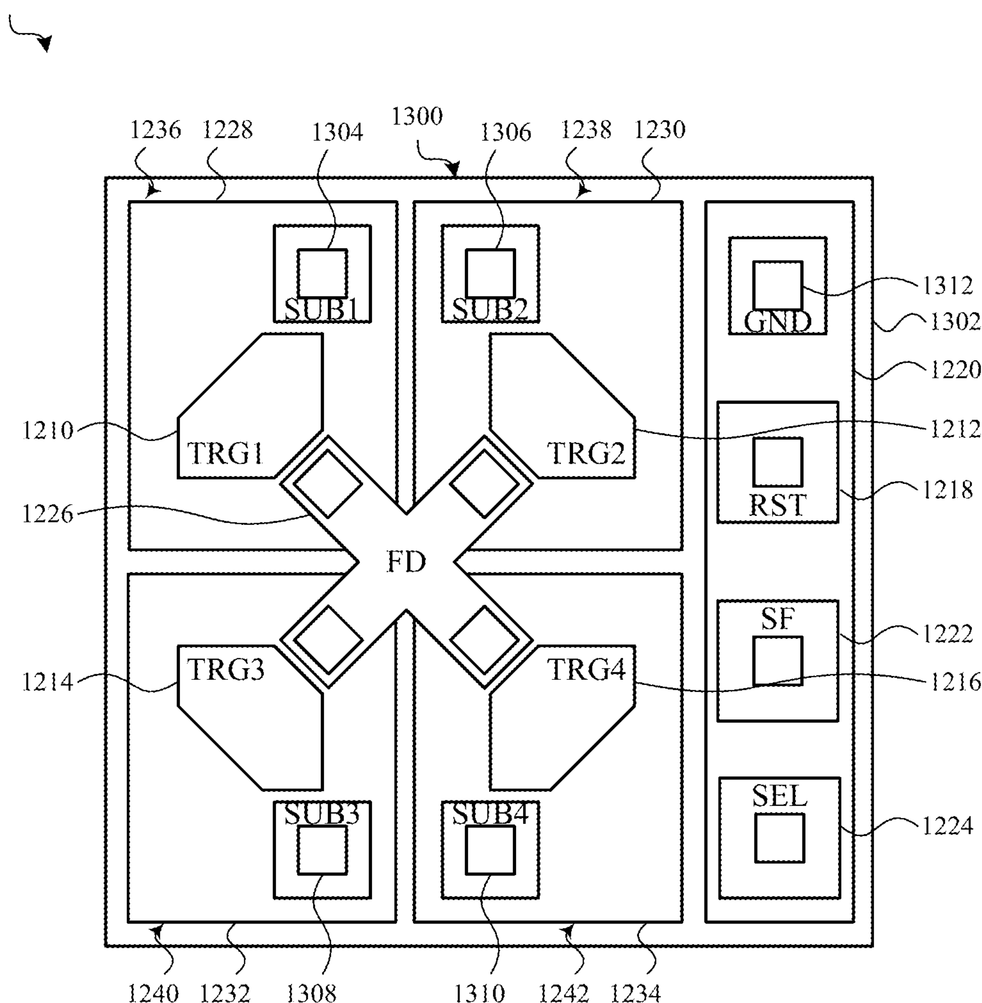
FIG. 13 shows a layout view of the set of pixels described with reference to FIG. 12, on a semiconductor substrate including a set of substrate portions.

FIG. 13 shows a layout view of the set of pixels 1200 described with reference to FIG. 12, on a semiconductor substrate 1300 including the set of substrate portions 1220, 1228, 1230, 1232, 1234. Each substrate portion 1220, 1228, 1230, 1232, 1234 may be electrically isolated from other substrate portions. For example, each substrate portion may be electrically isolated from each other substrate portion of the set of substrate portions 1220, 1228, 1230, 1232, 1234. In some embodiments, the substrate portions 1220, 1228, 1230, 1232, 1234 may be electrically isolated from each other by oxide walls (e.g., DTI 1302). In other embodiments, the substrate portions 1228, 1230, 1232, 1234 may be electrically isolated from each other by DTI in combination with other types of isolation (e.g., STI) and/or combinations of different types of isolation structures, such as other types of oxide walls.

A different pixel 1236, 1238, 1240, 1242 in the set of pixels 1200 may be associated with (e.g., disposed on or in, and biased by) each of the first through fourth substrate portions 1228, 1230, 1232, 1234. Each pixel 1236, 1238, 1240, 1242 may include a respective photodiode 1202, 1204, 1206, 1208 of the set of photodiodes (not shown in FIG. 13), and a respective charge transfer gate 1210, 1212, 1214, 1216 of the set of charge transfer gates. Each charge transfer gate may be operable to selectively connect a respective photodiode to the charge storage node 1226.

The set of transistors that is shared by the set of pixels 1200 is disposed on and biased by the fifth substrate portions 1220. For example, the reset transistor 1218, the source follower transistor 1222, and the readout transistor 1224 may be disposed on the fifth substrate portion 1220.

As shown, each of the photodiodes 1202, 1204, 1206, 1208, transistors 1210, 1212, 1214, 1216, 1218, 1222, 1224, and charge storage node 1226 may be biased by applying a bias signal SUB1, SUB2, SUB3, SUB4, or GND to a respective bias contact 1304, 1306, 1308, 1310, 1312 on a respective substrate portion 1220, 1228, 1230, 1232, 1234. A control circuit, such as the control circuit described with reference to FIG. 2, may be operable to change the bias (SUB1, SUB2, SUB3, SUB4) applied to one or more of the substrate portions 1228, 1230, 1232, 1234 during some modes of operation of the pixels 1236, 1238, 1240, 1242 (e.g., dynamically bias each substrate portion independently of each other substrate portion), and may enable the set of pixels 1200 to be operated without a charge pump.

When reading out a charge for each of the pixels 1236, 1238, 1240, 1242 (e.g., in a high resolution mode), the biases SUB1, SUB2, SUB3, and SUB4 may be sequentially pulsed to ground, or to a different voltage, as charge transfer and readout for the different pixels 1236, 1238, 1240, 1242 is performed sequentially using the shared charge storage node 1226. When reading out a summed charge for all of the pixels 1236, 1238, 1240, 1242 (e.g., in a binned charge mode), the biases SUB1, SUB2, SUB3, and SUB4 may be pulsed to ground or a different voltage at the same time, as charge transfer and readout for the different pixels 1236, 1238, 1240, 1242 is performed in one operation using the shared charge storage node 1226. In either readout mode, a stacked reset may be used to avoid excessive leakage (e.g., if SUB1 or SUB2 is grounded during charge transfer).

FIGS. 14A-14F show an example operation of a pixel 1400, such as one of the pixels (e.g., the first pixel) shown in FIGS. 12 and 13. During the pixel's operation, a substrate portion 1402 on which the pixel's photodiode 1404 and charge transfer gate 1406 are disposed is biased to a first voltage or a second voltage during the pixel's different modes of operation, while the substrate portion on which a set of pixel transistors is disposed is biased to a constant voltage (e.g., 0V). By way of example, the voltages are shown to be 0V and 1.5V. Also by way of example, the pixel's power rail voltages may be 0V and 2.8V. The 1.5V voltage may be directly used from a supply voltage, or generated from the power rail voltages using an LDO regulator.

FIGS. 14A-14F replace the substrate bias (SUB1) and transistor gate signals RST, TRG, and SEL with actual voltages or states.

Figure 14A:
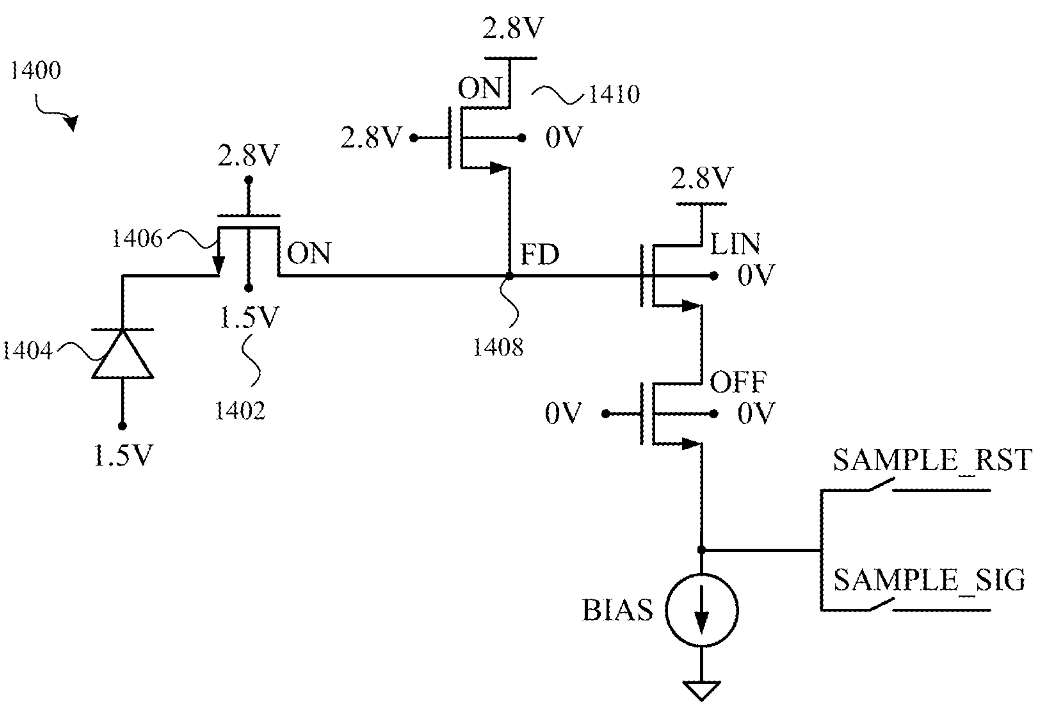
FIGS. 14A-14F show an example operation of a pixel, such as one of the pixels (e.g., the first pixel) shown in FIGS. 12 and 13.

FIG. 14A shows the pixel 1400 in a reset mode. In this mode, the substrate portion 1402 is biased to 1.5V, the RST and TRG signals are driven to 2.8V so that the charge storage node 1408 can be cleared, and the SEL signal is driven to 0V.

Figure 14B:
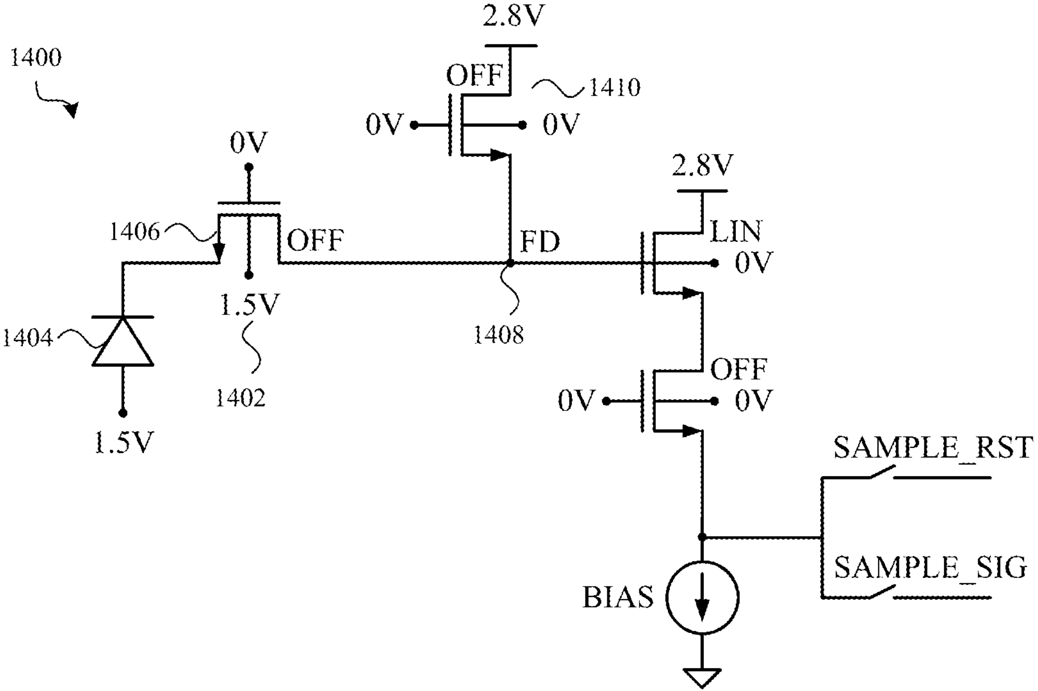

FIG. 14B shows the pixel 1400 in an integration mode. In this mode, the substrate portion 1402 is biased to 1.5V, and the RST, TRG, and SEL signals are driven to 0V. In this mode, a charge is integrated by the photodiode 1404.

Figure 14C:
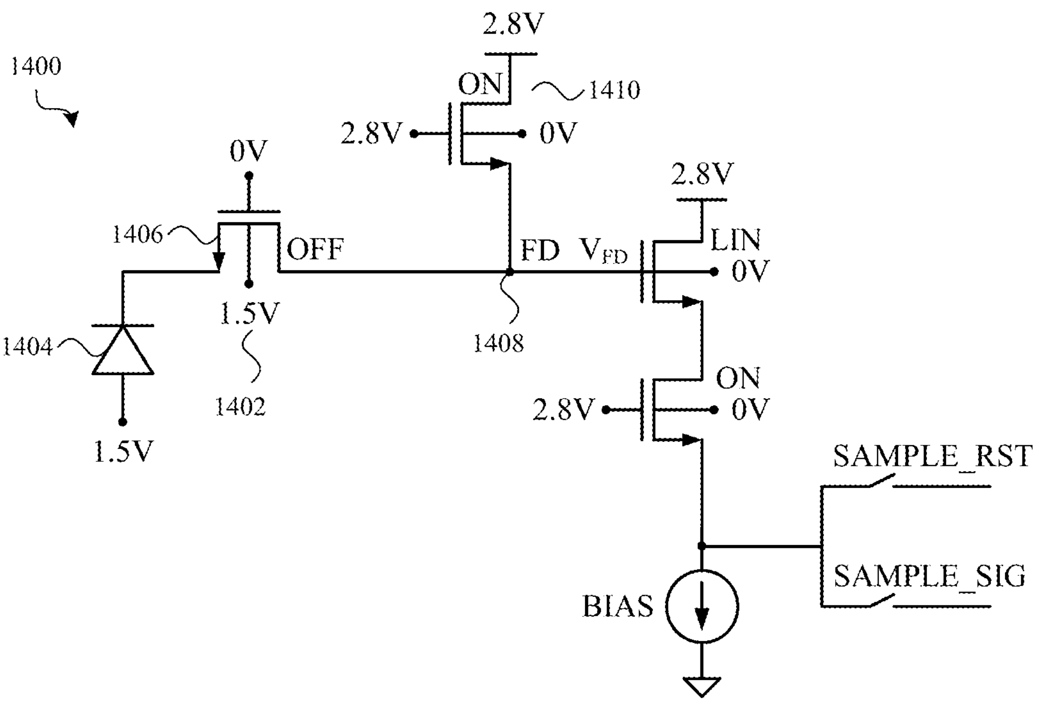

FIG. 14C shows the pixel 1400 in a charge storage node reset mode. In this mode, the substrate portion 1402 is biased to 1.5V, the RST and SEL signals are driven to 2.8V, and the TRG signal is driven to 0V. In this mode, the charge storage node 1408 is cleared.

Figure 14D:
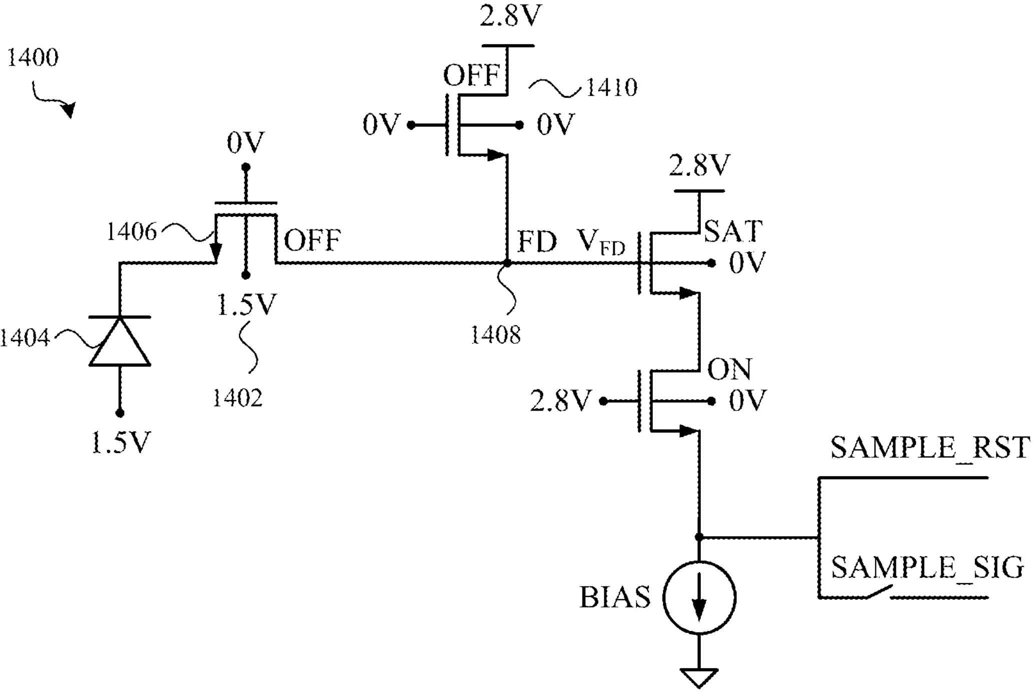

FIG. 14D shows the pixel 1400 in a charge storage node readout mode. In this mode, the substrate portion 1402 is biased to 1.5V, the RST and TRG signals are driven to 0V, and the SEL signal is driven to 2.8V. In this mode, a bias of the charge storage node 1408 is read out and saved in a first memory location.

Figure 14E:
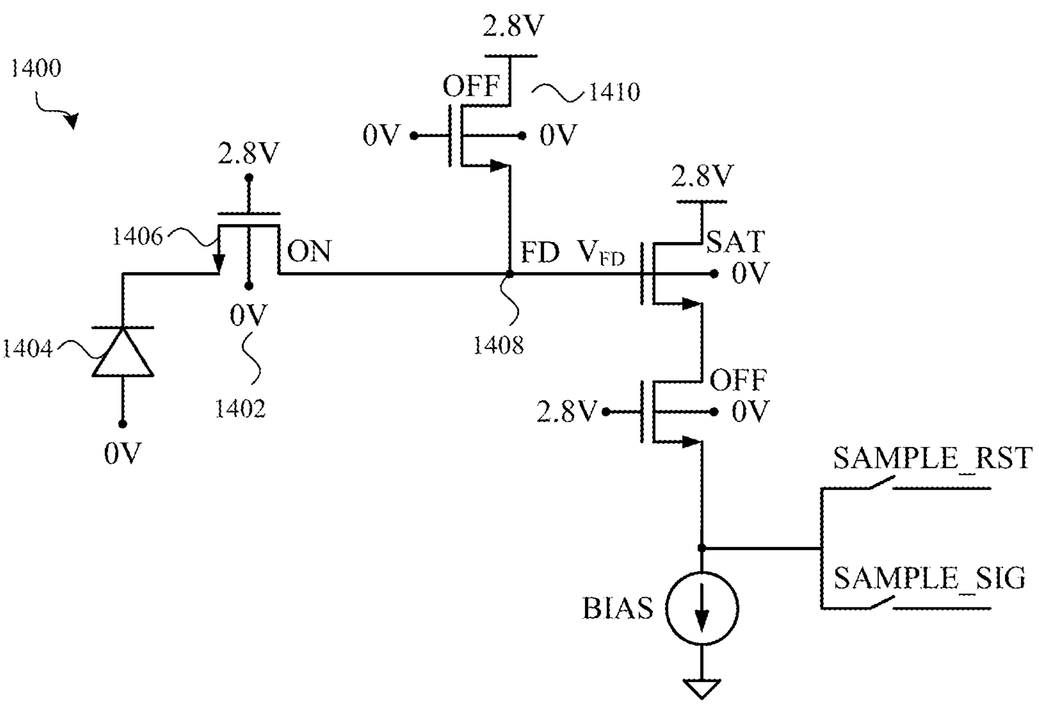

FIG. 14E shows the pixel 1400 in a charge transfer mode. In this mode, the substrate portion 1402 is temporarily biased to 0V, the RST and SEL signals are driven to 0V, and the TRG signal is driven to 2.8V. In this mode, the charge integrated by the photodiode 1404 during the integration mode is transferred to the charge storage node 1408.

Figure 14F:
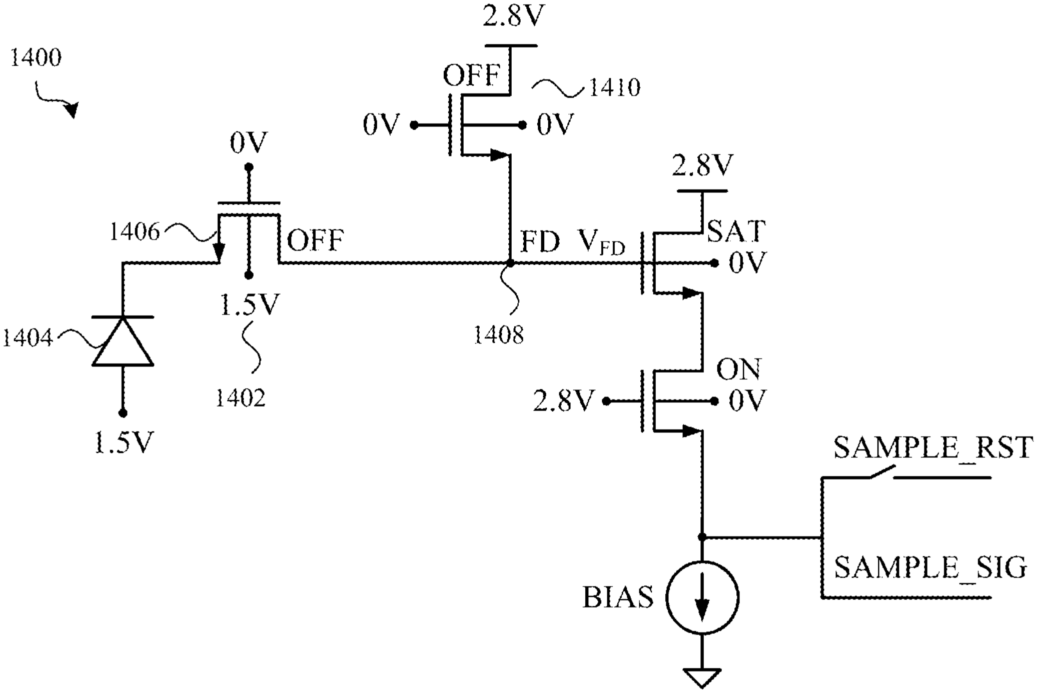

FIG. 14F shows the pixel 1400 in a readout mode. In this mode, the substrate portion 1402 is biased to 1.5V, the RST and TRG signals are driven to 0V, and the SEL signal is driven to 2.8V. In this mode, the value of the charge stored by the charge storage node 1408 may be read out and saved in a second memory location.

The substrate portion 1402 is therefore biased to 1.5V during all modes of operation but for the charge transfer mode, which enables easier transfer of charge from the photodiode 1404 to the charge storage node 1408.

Figure 15:
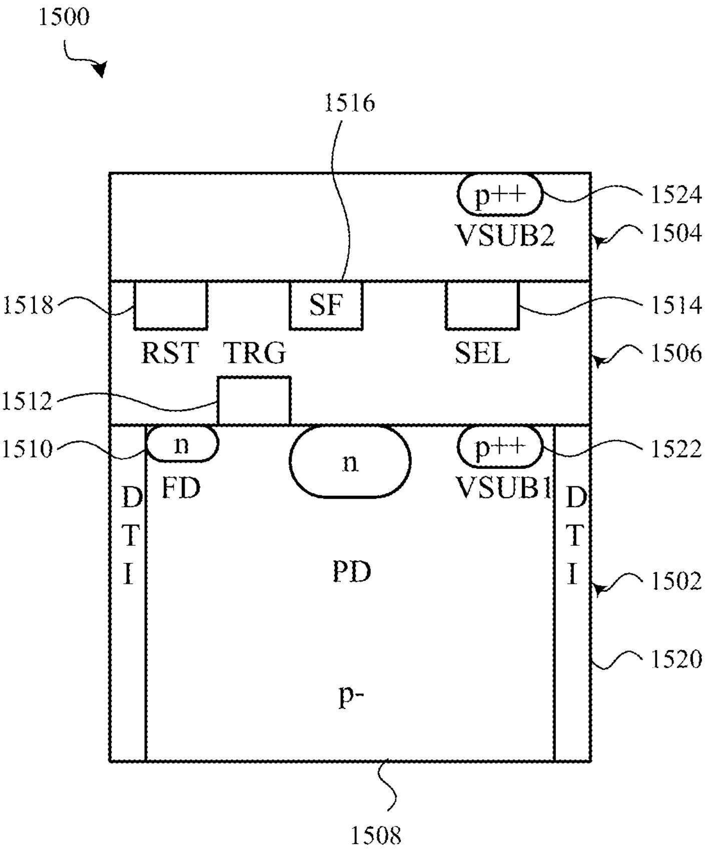
FIG. 15 shows an alternative to what is shown in FIGS. 11 and 13, in which different substrate portions are disposed on different substrates.

FIG. 15 shows an alternative to what is shown in FIGS. 11 and 13, in which different substrate portions are disposed on different substrates (or different substrate planes, or different substrate portions in the case of a singular flexible substrate that is folded to approximate more than one substrate). By way of example, FIG. 15 only shows a single pixel 1500, but the principles illustrated in FIG. 15 may be extrapolated to multiple pixel designs, in which multiple pixels do or do not share a charge storage node.

As shown in FIG. 15, the components of a pixel 1500 may be distributed amongst different substrates, such as a first substrate 1502 and a second substrate 1504 disposed in a substrate stack (i.e., a structure in which the first substrate 1502 and the second substrate 1504 are stacked). The different substrates 1502, 1504 may also be referred to herein as different substrate portions (i.e., different substrate portions that happen to be embodied in different substrates 1502, 1504). Electrical connections may be made between the substrates 1502, 1504 in various conventional ways. For examples, connections may be made via interconnect 1506 that includes one or more of bond pads, solder bumps, vias, an interposer, and so on.

The pixel 1500 may include a photodiode 1508, a charge storage node 1510, a charge transfer gate 1512, a select transistor 1514, a source follower transistor 1516, and a reset transistor 1518. A portion of the first substrate 1502 on which the photodiode 1508, charge storage node 1510, and charge transfer gate 1512 are formed may be surrounded by DTI 1520 or other types of electrical isolation (e.g., other types of oxide walls). Optionally, a portion of the second substrate 1504 on which the select transistor 1514, source follower transistor 1516, and reset transistor 1518 is formed may be surrounded by DTI.

A bias potential may be applied to the first substrate 1502 via a bias contact 1522, and a bias may be applied to the second substrate 1504 via a bias contact 1524.

The above embodiments have been described primarily with reference to rolling shutter image sensors. However, multi-potential dynamic substrate biasing may also be used to improve the operation of global shutter image sensors (i.e., image sensors in which all of the pixels of a pixel array are exposed to light at the same time, and then subsequently read out after a delay). Global shutter image sensors may be used, advantageously and by way of example, in applications that cannot tolerate motion artifacts, such as automotive and/or high-speed imaging applications. In contrast, rolling shutter image sensors may be used, advantageously and by way of example, in applications that require a high resolution image sensor with densely packed pixels and/or in low light applications.

Figure 16:
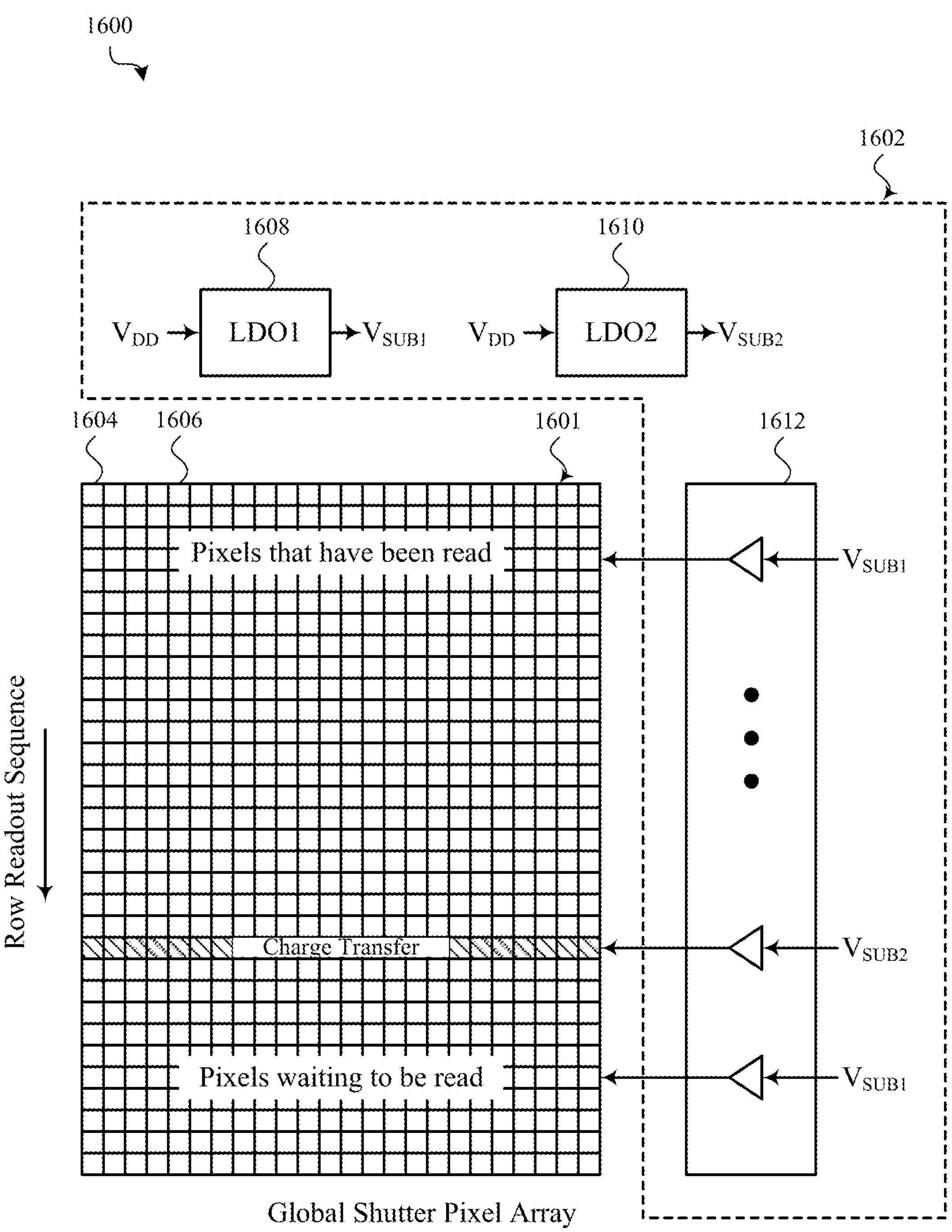
FIG. 16 shows an example global shutter architecture of an image sensor that employs independent dynamic substrate biasing.

FIG. 16 shows an example global shutter architecture of an image sensor 1600 that employs independent dynamic substrate biasing. The top-level architecture shows some components of the image sensor 1600, namely, a pixel array 1601 and a control circuit 1602. In some embodiments, the image sensor 1600 may be an image sensor used in one of the cameras described with reference to FIGS. 1A and 1B (or a camera in another type of device). In some cases, the image sensor 1600 may be a CMOS image sensor.

The image sensor 1600 may include a set (e.g., an array 1601) of pixels (e.g., pixels 1604, 1606, and so on). The set of pixels may be associated with a corresponding set of filter elements arranged in a filter pattern. Different subsets of pixels in the set of pixels may receive light through different types of filter elements in the set of filter elements. In some embodiments, the different types of filter elements may include red filter elements, green filter elements, and blue filter elements (i.e., RGB filter elements), which filter elements may be arranged in a Bayer color filter pattern. In some embodiments, the different types of filter elements may include other types of colored filter elements (e.g., CYGM filter elements), or types of filter elements that vary by other than color (e.g., IR or UV filter elements).

Alternatively, the set of pixels 1601 may receive unfiltered light, or the set of pixels may receive light that is filtered in the same or similar ways (e.g., filtered in a monochrome manner).

The control circuit 1602 may be a singular or distributed controller (e.g., one or more control circuits) for controlling a shutter, exposure, integration time, and so on for the pixels 1604, 1606 of the set of pixels; for operating the set of pixels in a particular mode; for performing a readout of various pixels (e.g., individual pixels or lines of pixels) of the set of pixels; and so on.

When acquiring an image using the image sensor 1600, and during an image frame, each pixel 1604, 1606 may be cycled through different modes or states of operation. The modes may include, for example, a reset mode (a pixel reset mode), an integration mode, a global charge transfer mode (a PD charge transfer mode), a charge storage mode (a waiting for readout mode), a pixel charge transfer mode (an FD node charge transfer mode), and a readout mode (an FD node readout mode). In an image sensor configured to perform a readout with CDS, the modes may include a reset mode, an integration mode, a global charge transfer mode, a charge storage mode, a charge storage node reset mode (e.g., an FD node reset mode), a charge storage node readout mode (e.g., an FD node readout mode for reading the charge on an FD node before charge is transferred to the FD node from a photodiode), a pixel charge transfer mode, and a readout mode.

As previously mentioned, the different modes through which a pixel is cycled may require the application of different voltages to some or all of the pixel's transistors. Some of the voltages may positively bias one or more transistors with respect to the bias of the substrate on which the transistor(s) are formed. Some of the voltages may negatively bias one or more transistors with respect to the bias of the substrate on which the transistor(s) are formed.

The pixel array 1601 may be operated with or without charge pumps. In lieu of charge pumps, the pixel array 1601 may be operated using one or more LDO regulators 1608, 1610 that generate one or more voltages within the image sensor's power rail voltages.

As an example, FIG. 16 shows circuitry 1612 of the control circuit 1602 that receives various input voltages derived from the image sensor's power rail voltages (e.g., $V_{DD}$) and GND) and/or the output(s) (e.g., $V_{SUB1}$, $V_{SUB2}$) of one or more LDO regulators 1608, 1610. Using the received voltages, the circuitry 1612 may operate the pixel array 1601 in a global shutter mode of operation by biasing different substrate portions of the image sensor 1600 to different voltages during different modes of operation of different lines of pixels. By way of example, the circuitry 1612 is shown to bias substrate portions on which the transistors of all lines of pixels reside, but for those lines of pixels that are currently involved in a global charge transfer mode or a pixel charge transfer mode, to $V_{SUB1}$. The circuitry 1612 biases substrate portions on which the transistors of lines of pixel that are currently involved in a global charge transfer mode or a pixel charge transfer mode to $V_{SUB2}$. As the lines of pixels cycle through different modes of operation, the circuitry 1612 may at times bias the image sensor's substrate portions to different voltages.

Figure 17:
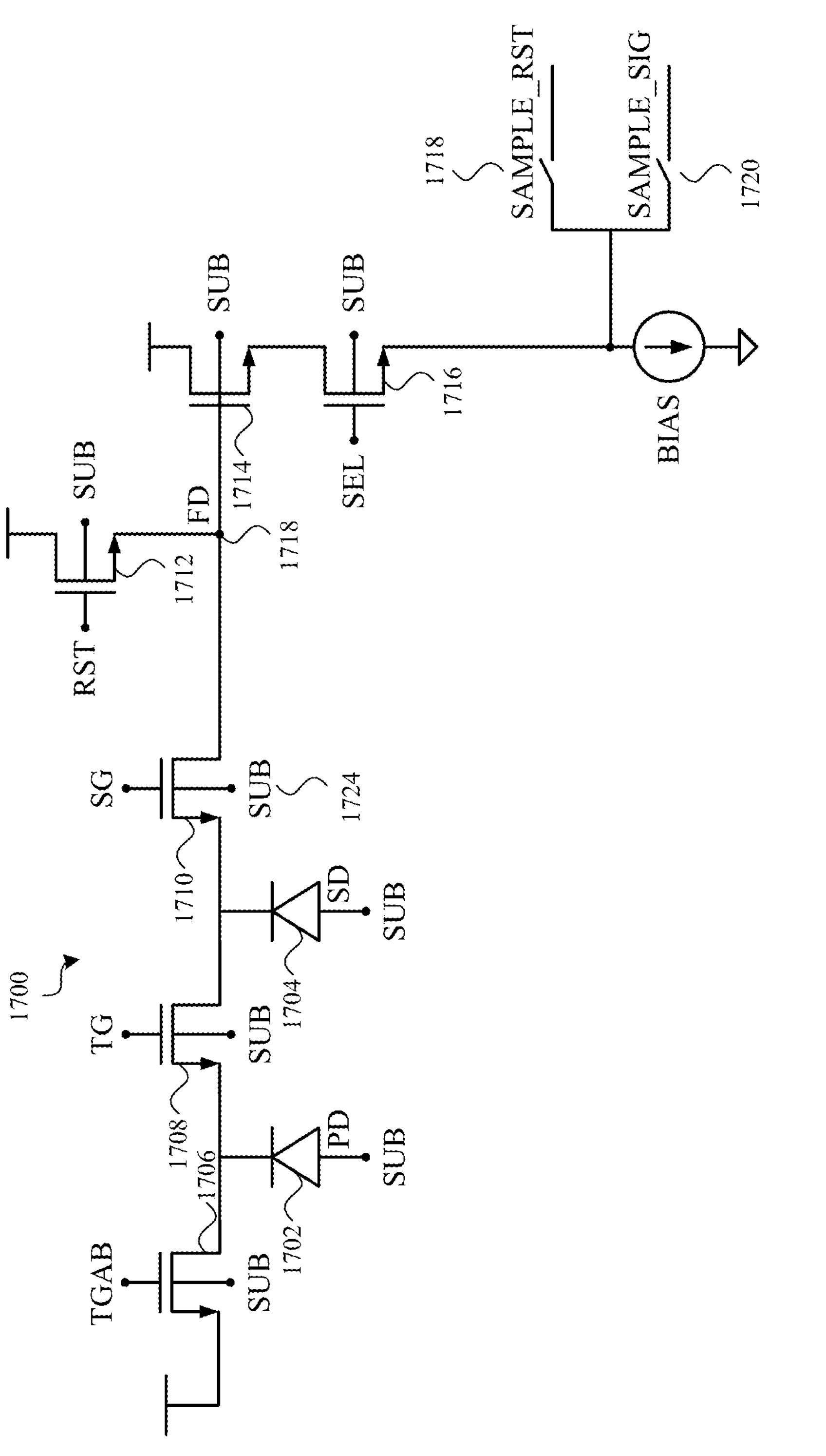
FIG. 17 shows an example schematic of a global shutter pixel, such as a pixel of one of the image sensors described with reference to FIG. 1A-1B or 2.

FIG. 17 shows an example schematic of a global shutter pixel 1700, such as a pixel of one of the image sensors described with reference to FIG. 1A-1B or 2. The pixel 1700 may include a photodiode 1702, a storage diode 1704, and a set of transistors. The set of transistors may include an anti-blooming transfer gate 1706, a global charge transfer gate 1708, a pixel charge transfer gate 1710, a charge storage node reset transistor 1712 (hereafter referred to as a reset transistor 1712), a charge storage node readout transistor 1714 (hereafter referred to as a source follower transistor 1714), and a readout select transistor 1716 (hereafter referred to as a select transistor 1716).

The anti-blooming transfer gate 1706 may be operable to selectively bleed excess charge from the photodiode 1702, responsive to a gate signal TGAB, so that the photodiode 1702 does not exceed its full well capacity. The anti-blooming transfer gate 1706 may also be operable to help reset the photodiode 1702 prior to beginning an integration mode of the pixel 1700. The global charge transfer gate 1708 may be operable to selectively couple or de-couple an output of the photodiode 1702 to the storage diode 1704, responsive to a gate signal TG, to transfer a charge integrated by the photodiode 1702 to the storage diode 1704, or to block the transfer of charge from the photodiode 1702 to the storage diode 1704. The pixel charge transfer gate 1710 may be operable to selectively couple or de-couple an output of the storage diode 1704 to a charge storage node 1718 (e.g., an FD node), responsive to a gate signal SG, to transfer a charge integrated by the storage diode 1704 to the charge storage node 1718, or to block the transfer of charge from the storage diode 1704 to the charge storage node 1718. The reset transistor 1712 may be used to selectively reset (or bias) the charge storage node 1718, the storage diode 1704, and/or the photodiode 1702 to a predetermined value, responsive to a gate signal RST. The source follower transistor 1714 may have a gate voltage determined by the voltage of, or the value of the charge stored by, the charge storage node 1718. The source follower transistor 1714, in conjunction with the select transistor 1716, may be used to readout the charge storage node 1718 (e.g., the bias of, or the value of the charge stored by, the charge storage node) when a gate signal SEL is selectively applied to the select transistor 1716.

When the pixel 1700 is configured to perform a readout with CDS, and for an image frame, the photodiode 1702, storage diode 1704, and charge storage node 1718 may be reset via the reset transistor 306 and pixel charge transfer gate 1710 (and/or via the anti-blooming gate 1706); then the global and pixel charge transfer gates 1708, 1710 may electrically isolate the photodiode 1702 and storage diode 1704 from each other and from the charge storage node 1718; then the photodiode 1702 may integrate charge during an integration period; then the charge integrated by the photodiode 1702 may be transferred to the storage diode 1704 via the global charge transfer gate 1708; then the charge storage node 1718 may be reset again, using the reset transistor 1712; then the voltage of the charge storage node 1718 may be read out through the source follower and select transistors 1714, 1716 and temporarily stored by closing a first readout switch 1720 (SAMPLE_RST) while a second readout switch 1722 (SAMPLE_SIG) remains open; then the charge transfer gate 1710 may be used to transfer the charge stored by the storage diode 1704 to the charge storage node 1718; and the charge stored by the charge storage node 1718 may be read out through the source follower and select transistors 1714, 1716 and temporarily stored by closing the second readout switch 1722 while the first readout switch 1720 remains open. These operations may then be repeated for a next image frame.

As shown, each of the photodiode 1702, storage diode 1704, transistors 1706, 1708, 1710, 1712, 1714, 1716, and charge storage node 1718 may be formed or otherwise disposed on a common substrate 1724 and biased by the common substrate 1724. A control circuit, such as the control circuit described with reference to FIG. 16, may be operable to change the bias (SUB) applied to the substrate during some modes of operation of the pixel 1700, and may enable the pixel 1700 to be operated without a charge pump. Alternatively, different elements of the pixel 1700 may reside on different substrate portions, and the control circuit may independently change the bias of the different substrate portions, as described elsewhere herein.

Figure 18:
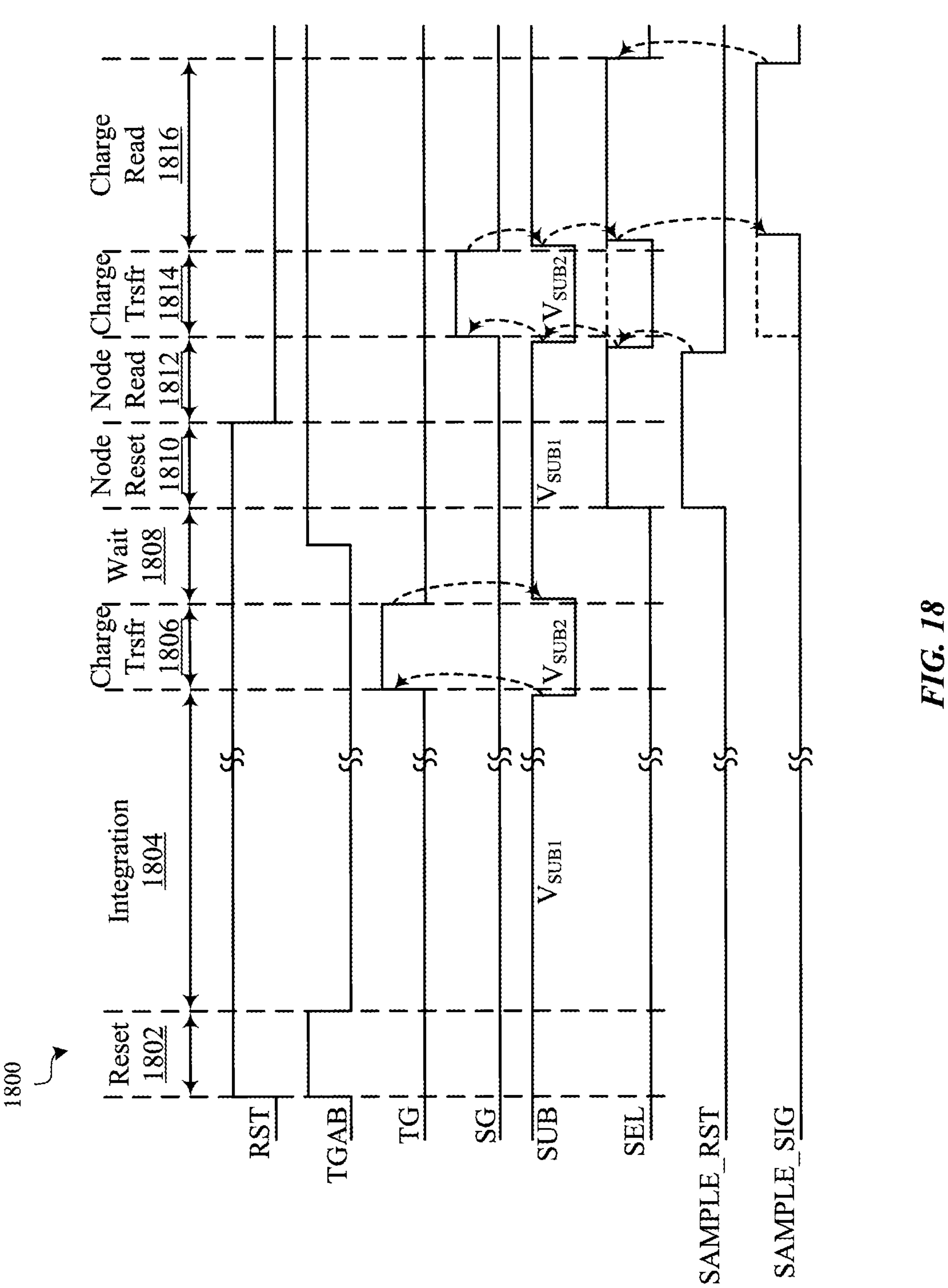
FIG. 18 shows an example operation of a pixel, such as the pixel shown in FIG. 17.

FIG. 18 shows an example timing 1800 of transitions between the modes of operation discussed with reference to FIGS. 16 and 17. During a reset mode 1802, the RST, TGAB, and SUB signals may be transitioned or held high, while other signals are held low, to reset the photodiode 1702 and charge storage node 1718 described with reference to FIG. 17. Holding the SUB signal high biases the substrate 1724 to $V_{SUB1}$.

During an integration mode 1804 following the reset mode 1802, the RST and SUB signals may remain high while the TGAB signal is transitioned low. In this mode, the photodiode 1702 may integrate a charge. During the integration mode, the pixel charge transfer gate 1710 is negatively biased and the storage diode 1704 is electrically isolated from the charge storage node 1718. Similarly, the global charge transfer gate 1708 is negatively biased and the photodiode 1702 is electrically isolated from the storage diode 1704.

Before a global charge transfer mode 1806 following the integration mode 1804, the SUB signal may be transitioned low. During the global charge transfer mode 1806, the TG signal may be transitioned high. This biases the substrate 1724 to $V_{SUB2}$, positively biases the global charge transfer gate 1708, and enables a transfer of charge from the photodiode 1702 to the storage diode 1704.

During a charge storage mode 1808 following the global charge transfer mode 1806, the SUB signal may be transitioned high while the TG signal is transitioned low. This again biases the substrate 1724 to $V_{SUB1}$ and stores a charge at the storage diode 1704. During the charge storage mode 1808, and before the charge storage node reset mode 1810, the TGAB signal may be transitioned high.

During a charge storage node reset mode 1810 (i.e., the beginning of a CDS readout) following the charge storage mode 1808, the SEL and SAMPLE_RST signals may be transitioned high while the charge storage node 1718 is in a reset mode. The RST signal may then be transitioned low during a charge storage node readout mode 1812 in which a baseline charge (or noise value) is read from the charge storage node 1718.

Before a pixel charge transfer mode 1814 following the charge storage node readout mode 1812, the SEL and SAMPLE_RST signals may be transitioned low, and the SUB signal may be transitioned low. During the pixel charge transfer mode 1814, the SG signal may be transitioned high. This biases the substrate 1724 to $V_{SUB2}$, positively biases the pixel charge transfer gate 1710, and transfers charge from the storage diode 1704 to the charge storage node 1718.

During a readout mode 1816 following the pixel charge transfer mode 1814, the SEL and SAMPLE_SIG signals may be transitioned high while the charge that was initially integrated by the photodiode 1702, plus any noise, is read out of the charge storage node 1718. The various modes of operation may then be repeated for a next image frame, if any.

The embodiments described herein do not require the use of a charge pump. However, in some cases, the techniques described herein may be employed along with the use of one or more charge pumps. For example, multi-potential dynamic substrate biasing may be employed along with one or more charge pumps to improve image sensor yield and/or enhance pixel performance.

In regard to sensor yield improvement and/or pixel performance enhancement, an image sensor may need to meet stringent pixel performance requirements and/or provide a particular image quality. However, meeting such requirements can be challenging, and is becoming more challenging as pixel size shrinks to sub-micron dimensions. Factors such as too many pixel defects, image lag, or both, can cause an image sensor to be discarded, thereby reducing yield and increasing the average cost of an image sensor. Pixel process tuning during image sensor fabrication, and pixel performance testing and evaluation (both pre- and post-integration of an image sensor into a device), can improve yield but typically requires a significant investment of time and money. Pixel performance tuning and/or image processing in the field can consume power and interfere with user experience.

Multi-potential dynamic substrate biasing can be used to improve image sensor yield-especially when combined with the use of charge pumps. For example, an appropriate substrate bias can be determined during image sensor test, and may be used to calibrate a particular image sensor (e.g., to overcome pixel defects, image lag, or both). In some cases, a substrate voltage (i.e., a substrate bias) may be set positive during a pixel's integration mode, to reduce dark current and overcome pixel defects. In some cases, a substrate voltage may be set negative during a pixel's charge transfer mode, to reduce image lag.

Figures 19A, 19B:
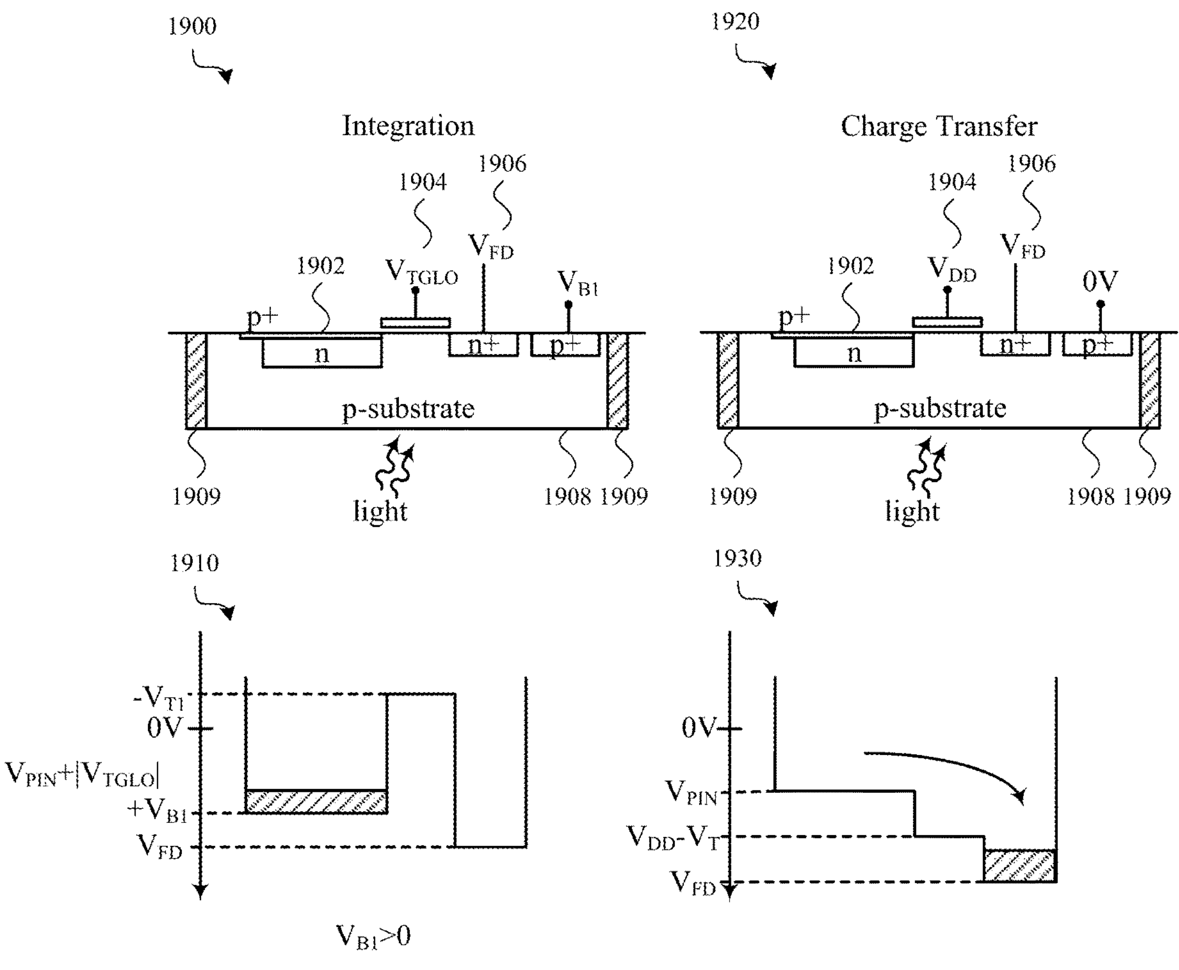
FIGS. 19A and 19B illustrate another layout cross-section and corresponding potential diagram for a photodiode, a charge transfer gate, a charge storage node, and a substrate of a pixel, during an integration mode (FIG. 19A) and a charge transfer mode (FIG. 19B), respectively.

FIGS. 19A and 19B illustrate a layout cross-section and corresponding potential diagram for a photodiode 1902, a charge transfer gate 1904, a charge storage node 1906, and a substrate 1908 of a pixel, during an integration mode 1900 (FIG. 19A) and during a charge transfer mode 1920 (FIG. 19B), respectively. The photodiode 1902, charge transfer gate 1904, charge storage node 1906, and substrate 1908 are examples of some of the structures shown schematically in FIG. 3. The substrate 1908 (or substrate portion) may be isolated from other substrates or substrate portions by isolation 1909 (e.g., DTI).

As shown in FIG. 19A, and assuming that the pixel has a defect due to a dark current, the substrate 1908 may be biased to a positive voltage that is high enough to sufficiently reduce the pixel's dark current and overcome the pixel defect. The voltage $V_{B1}$ may be greater than a voltage applied to the gate of the charge transfer gate 1904 during the integration mode 1900. As an example, the substrate 1908 may be biased to a positive bias voltage ($V_{B1}$), and the TRG signal applied to the gate of the charge transfer gate 1904 may be a voltage ($V_{TGLO}$) that is less than the voltage $V_{B1}$. In some cases, $V_{TGLO}$ may be a negative voltage, generated by a charge pump. The voltages $V_{B1}$ and $V_{TGLO}$ negatively biases the charge transfer gate 1904 and electrically isolate the photodiode 1902 from the charge storage node 1906, while driving the charge transfer gate 1904 deeper into accumulation, reducing dark current, and overcoming a pixel defect. In some cases, the voltage $V_{B1}$ may also be generated using a charge pump. In some cases, the substrate bias voltage for the pixel's charge integration mode may be determined during device test—for an image sensor as a whole, or for a particular pixel or group of pixels of an image sensor.

A potential diagram 1910 shows the various potentials of the photodiode 1902, the gate of the charge transfer gate 1904, and the charge storage node 1906 during the integration mode 1900.

As shown in FIG. 19B, the substrate 1908 may be biased to the lowest voltage that can be generated with or without using a charge pump during the charge transfer mode 1920. As an example, the substrate 1908 may be biased to 0V, and the TRG signal applied to the gate of the charge transfer gate 1904 may be $V_{DD}$. This positively biases the charge transfer gate 1904 and allows the charge integrated by the photodiode 1902 during the integration mode 1900 to flow into the charge storage node 1906.

A potential diagram 1930 shows the various potentials of the photodiode 1902, the gate of the charge transfer gate 1904, and the charge storage node 1906 during the charge transfer mode 1920. The potentials enable a steep voltage drop between the photodiode 1902 and the charge storage node 1906, making it easier to transfer charge collected by the photodiode 1902 during the integration mode 1900 to the charge storage node 1906.

Figures 20A, 20B:
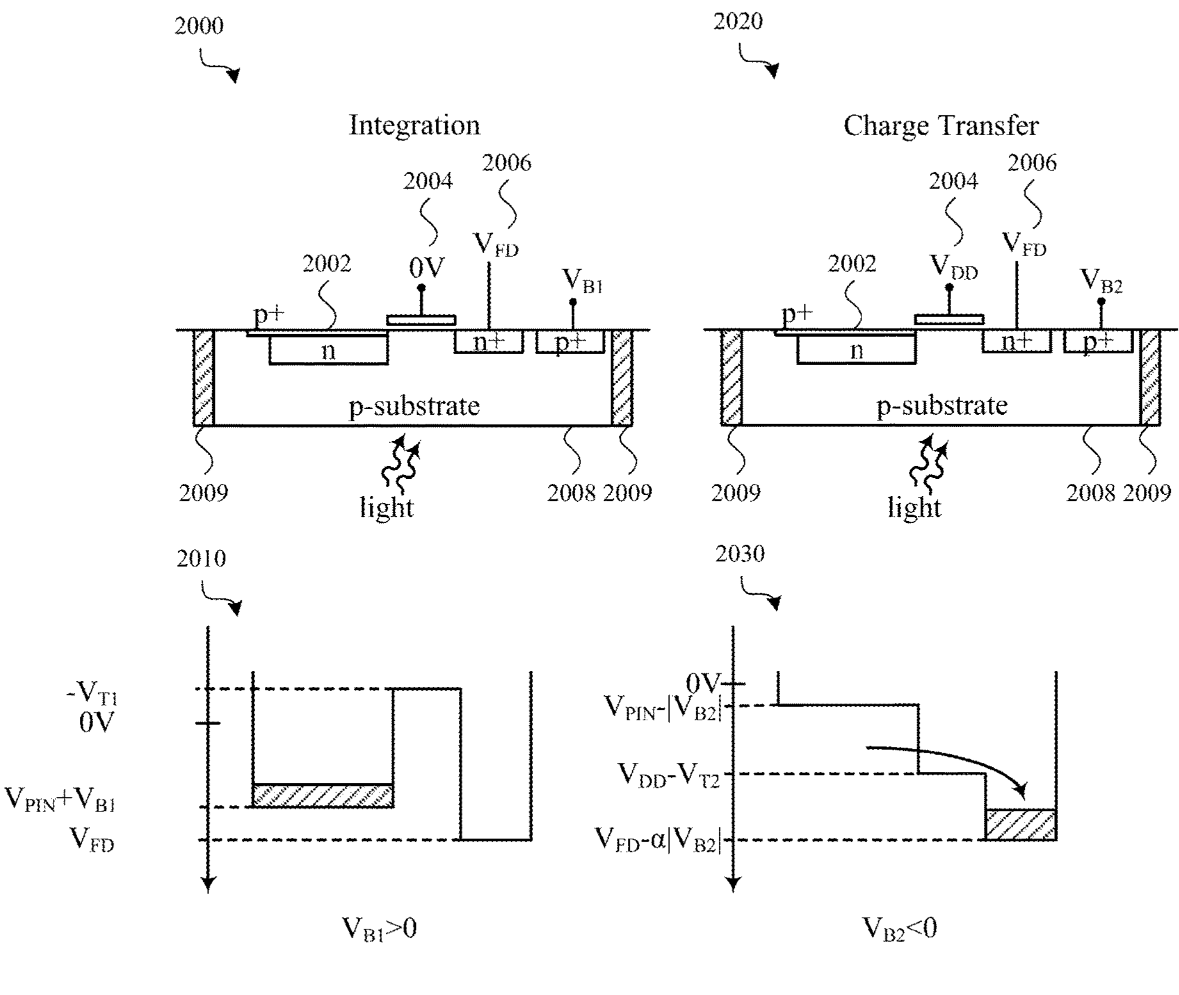
FIGS. 20A and 20B illustrate another layout cross-section and corresponding potential diagram for a photodiode, a charge transfer gate, a charge storage node, and a substrate of a pixel, during an integration mode (FIG. 20A) and a charge transfer mode (FIG. 20B), respectively.

FIGS. 20A and 20B illustrate a layout cross-section and corresponding potential diagram for a photodiode 2002, a charge transfer gate 2004, a charge storage node 2006, and a substrate 2008 of a pixel, during an integration mode 2000 (FIG. 20A) and during a charge transfer mode 2020 (FIG. 20B), respectively. The photodiode 2002, charge transfer gate 2004, charge storage node 2006, and substrate 2008 are examples of some of the structures shown schematically in FIG. 3. The substrate 2008 (or substrate portion) may be isolated from other substrates or substrate portions by isolation 2009 (e.g., DTI).

As shown in FIG. 20A, the substrate 2008 may be biased to a voltage that is greater than a voltage applied to the gate of the charge transfer gate 2004 during the integration mode 2000. As an example, the substrate 2008 may be biased to a positive bias voltage ($V_{B1}$), and the TRG signal applied to the gate of the charge transfer gate 2004 may be 0 V, or a negative voltage, or any other voltage. This negatively biases the charge transfer gate 2004 and electrically isolates the photodiode 2002 from the charge storage node 2006.

A potential diagram 2010 shows the various potentials of the photodiode 2002, the gate of the charge transfer gate 2004, and the charge storage node 2006 during the integration mode 2000.

As shown in FIG. 20B, and assuming that the pixel has failed an image lag test, the substrate 2008 may be biased to a voltage that is lower than a voltage applied to the gate of the charge transfer gate 2004 during the charge transfer mode 2020. In some cases, a charge pump may be used to bias the substrate 2008 to a negative voltage. Regardless of whether the voltage applied to the substrate 2008 is positive, 0 V, or negative, the voltage may be sufficiently low that it reduces the time it takes to transfer charge from the photodiode 2002 to the charge storage node 2006 and helps reduce the pixel's image lag to a level that meets a desired specification. As an example, the substrate 2008 may be biased to $V_{B2}$, and the TRG signal applied to the gate of the charge transfer gate 2004 may be $V_{DD}$, with $V_{B2}<0V$. This positively biases the charge transfer gate 2004 and allows the charge integrated by the photodiode 2002 during the integration mode 2000 to flow into the charge storage node 2006. In some cases, the substrate bias voltage for the pixel's charge transfer mode 2020 may be determined during device test—for an image sensor as a whole, or for a particular pixel or group of pixels of an image sensor.

A potential diagram 2030 shows the various potentials of the photodiode 2002, the gate of the charge transfer gate 2004, and the charge storage node 2006 during the charge transfer mode 2020. The potentials enable a larger potential difference between the photodiode and the charge storage node 2006, enhancing the transfer of charge collected by the photodiode 2002 during the integration mode 2000 to the charge storage node 2006.

The scenarios presented in FIGS. 19A and 19B, on one hand, and FIGS. 20A and 20B, on the other hand, differ in that the first scenario provides substrate bias-assisted charge integration, and the second scenario provides substrate bias-assisted charge transfer.

In regard to pixel performance enhancement, it may be desirable to provide an image sensor with high dynamic range. However, with shrinking pixel size, it is becoming increasingly challenging to maintain a pixel's full well capacity, maintain a low pixel dark current, and provide a high dynamic range, without causing an increase in pixel defects and/or image lag.

Multi-potential dynamic substrate biasing can be used to enhance pixel performance-especially when combined with the use of charge pumps. For example, a positive bias can be applied to a pixel substrate during a pixel's integration mode to increase the full well capacity of the pixel. Additionally or alternatively, a negative bias can be applied to a pixel substrate during a pixel's charge transfer mode to reduce the pixel's image lag (e.g., by creating a steeper slope between potentials and increasing the rate of charge transfer between a pixel's photodiode and charge storage node.

Figures 21A, 21B:
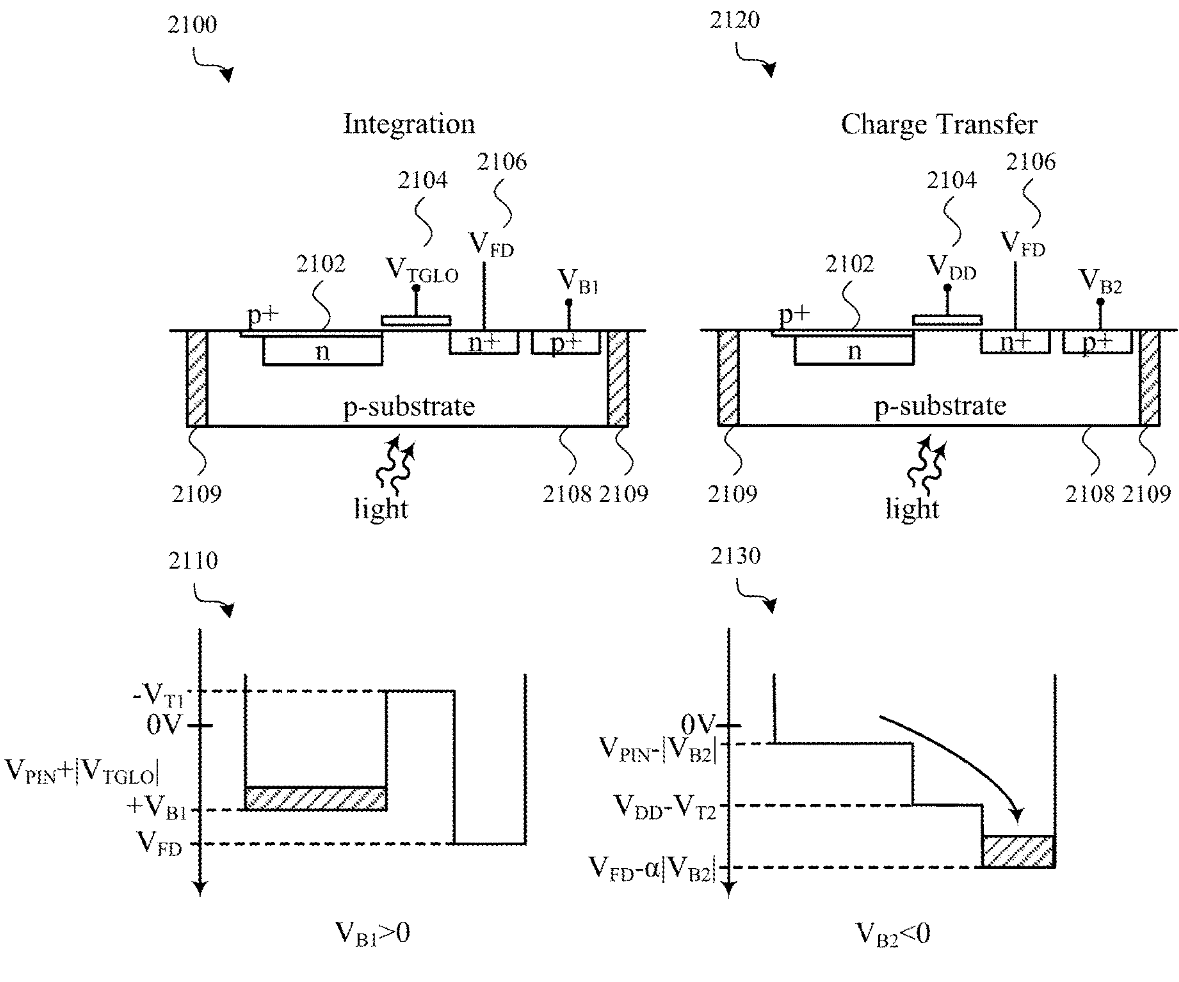
FIGS. 21A and 21B illustrate another layout cross-section and corresponding potential diagram for a photodiode, a charge transfer gate, a charge storage node, and a substrate of a pixel, during an integration mode (FIG. 21A) and a charge transfer mode (FIG. 21B), respectively.

FIGS. 21A and 21B illustrate a layout cross-section and corresponding potential diagram for a photodiode 2102, a charge transfer gate 2104, a charge storage node 2106, and a substrate 2108 of a pixel, during an integration mode 2100 (FIG. 21A) and a charge transfer mode 2120 (FIG. 21B), respectively. The photodiode 2102, charge transfer gate 2104, charge storage node 2106, and substrate 2108 are examples of some of the structures shown schematically in FIG. 3. The substrate 2108 (or substrate portion) may be isolated from other substrates or substrate portions by isolation 2109 (e.g., DTI).

As shown in FIG. 21A, the substrate 2108 may be biased to a positive voltage during the integration mode 2100. The positive voltage may be greater than a voltage applied to the gate of the charge transfer gate 2104 during the integration mode 2100. As an example, the substrate 2108 may be biased to a positive bias voltage ($V_{B1}$), and the TRG signal applied to the gate of the charge transfer gate 2104 may be a voltage ($V_{TGLO}$) that is less than the voltage $V_{B1}$. In some cases, $V_{TGLO}$ may be a negative voltage generated by a charge pump, though it need not be. The voltages $V_{B1}$ and $V_{TGLO}$ negatively bias the charge transfer gate 2104 and electrically isolate the photodiode 2102 from the charge storage node 2106, with the positive bias voltage applied to the substrate 2108 creating a deep full well capacity for the photodiode 2102 during the charge integration mode. In some cases, the voltage $V_{B1}$ may be generated using a charge pump, though it need not be.

A potential diagram 2110 shows the various potentials of the photodiode 2102, the gate of the charge transfer gate 2104, and the charge storage node 2106 during the integration mode 2100.

As shown in FIG. 21B, the substrate 2108 may be biased to a voltage that is lower than a voltage applied to the gate of the charge transfer gate 2104 during the charge transfer mode 2120. In some cases, a charge pump may be used to bias the substrate 2108 to a negative voltage. Regardless of whether the voltage applied to the substrate 2108 is positive, 0 V, or negative, the voltage may be sufficiently low that it reduces the time it takes to transfer charge from the photodiode 2102 to the charge storage node 2106 and helps reduce the pixel's image lag. As an example, the substrate 2108 may be biased to $V_{B2}$, and the TRG signal applied to the gate of the charge transfer gate 2104 may be $V_{DD}$, with $V_{B2}<0V$. This positively biases the charge transfer gate 2104 and allows the charge integrated by the photodiode 2102 during the integration mode 2100 to flow into the charge storage node 2106.

A potential diagram 2130 shows the various potentials of the photodiode 2102, the gate of the charge transfer gate 2104, and the charge storage node 2106 during the charge transfer mode 2120. The potentials enable a larger potential difference between the photodiode and the charge storage node 2106, enhancing the transfer of charge collected by the photodiode 2102 during the integration mode 2100 to the charge storage node 2106.

In any of the embodiments described herein, the pixel(s) may in some cases include more than one photodiode (i.e., a set of photodiodes) that share a common charge storage node, reset transistor, and/or set of readout transistors. In any of the embodiments described herein, the pixel(s) may be pixels of a multi-color image sensor (e.g., an RGB or CMYG image sensor), a monochrome image sensor (e.g., an IR image sensor), a time-of-flight sensor, a light detection and ranging (LIDAR) sensor, or other type of sensor having one or more pixels.

Figure 22:
FIG. 22 shows an example electrical block diagram of an electronic device.
Figure 22:
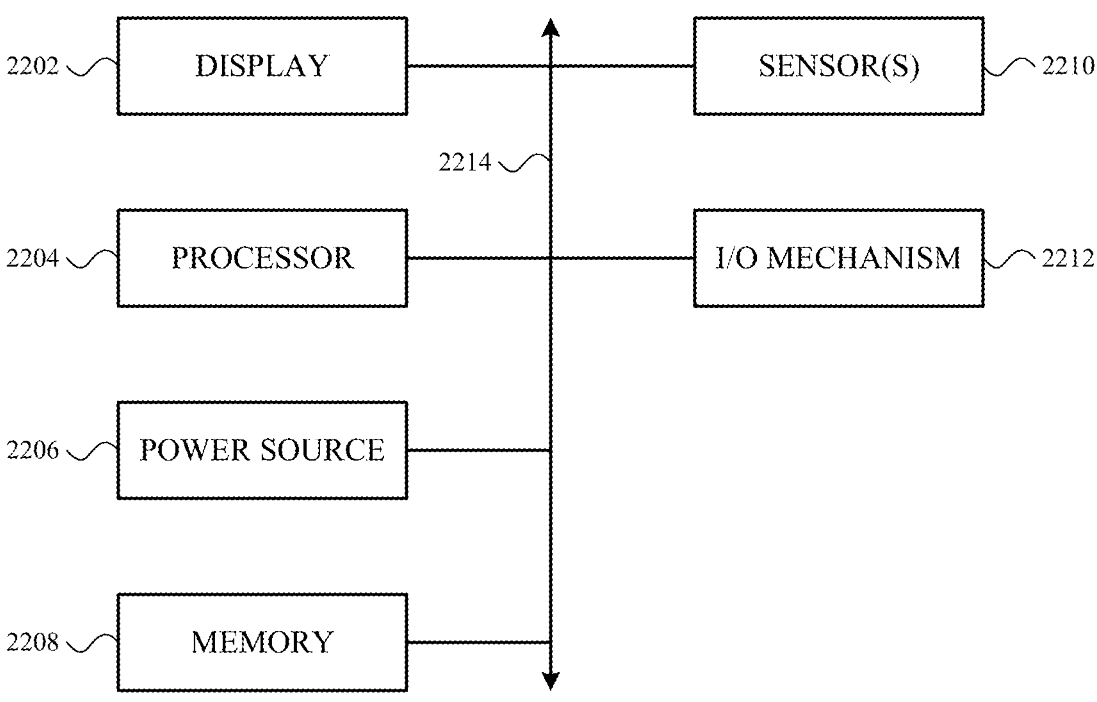

FIG. 22 shows a sample electrical block diagram of an electronic device 2200, which electronic device 2200 may in some cases be the electronic device described with reference to FIGS. 1A and 1B, and which electronic device 2200 may include an image sensor configured as described with any of FIGS. 2-21. The electronic device 2200 may optionally include an electronic display 2202 (e.g., a light-emitting display), a processor 2204, a power source 2206, a memory 2208 or storage device, a sensor system 2210, and/or an input/output (I/O) mechanism 2212 (e.g., an input/output device, input/output port, or haptic input/output interface). The processor 2204 may control some or all of the operations of the electronic device 2200. The processor 2204 may communicate, either directly or indirectly, with some or all of the other components of the electronic device 2200. For example, a system bus or other communication mechanism 2214 can provide communication between the electronic display 2202, the processor 2204, the power source 2206, the memory 2208, the sensor system 2210, and the I/O mechanism 2212.

The processor 2204 may be implemented as any electronic device capable of processing, receiving, or transmitting data or instructions, whether such data or instructions is in the form of software or firmware or otherwise encoded. For example, the processor 2204 may include a microprocessor, a central processing unit (CPU), an application-specific integrated circuit (ASIC), a digital signal processor (DSP), a control circuit, or a combination of such devices. As described herein, the term "processor" is meant to encompass a single processor or processing unit, multiple processors, multiple processing units, or other suitably configured computing element or elements. In some cases, the processor 2204 may provide part or all of the processing system or processor described herein.

It should be noted that the components of the electronic device 2200 can be controlled by multiple processors. For example, select components of the electronic device 2200 (e.g., the sensor system 2210) may be controlled by a first processor and other components of the electronic device 2200 (e.g., the electronic display 2202) may be controlled by a second processor, where the first and second processors may or may not be in communication with each other.

The power source 2206 can be implemented with any device capable of providing energy to the electronic device 2200. For example, the power source 2206 may include one or more batteries or rechargeable batteries. Additionally or alternatively, the power source 2206 may include a power connector or power cord that connects the electronic device 2200 to another power source, such as a wall outlet.

The memory 2208 may store electronic data that can be used by the electronic device 2200. For example, the memory 2208 may store electrical data or content such as, for example, audio and video files, documents and applications, device settings and user preferences, timing signals, control signals, instructions, and/or data structures or databases. The memory 2208 may include any type of memory. By way of example only, the memory 2208 may include random access memory, read-only memory, Flash memory, removable memory, other types of storage elements, or combinations of such memory types.

The electronic device 2200 may also include one or more sensor systems 2210 positioned almost anywhere on the electronic device 2200. In some cases, the sensor systems 2210 may include one or more of the image sensors described herein. The sensor system(s) 2210 may be configured to sense one or more types of parameters, such as but not limited to, vibration; light; touch; force; heat; movement; relative motion; biometric data (e.g., biological parameters) of a user; air quality; proximity; position; connectedness; surface quality; and so on. By way of example, the sensor system(s) 2210 may include an SMI sensor, a heat sensor, a position sensor, a light or optical sensor, an accelerometer, a pressure transducer, a gyroscope, a magnetometer, a health monitoring sensor, and an air quality sensor, and so on. Additionally, the one or more sensor systems 2210 may utilize any suitable sensing technology, including, but not limited to, interferometric, magnetic, capacitive, ultrasonic, resistive, optical, acoustic, piezoelectric, or thermal technologies.

The I/O mechanism 2212 may transmit or receive data from a user or another electronic device. The I/O mechanism 2212 may include the electronic display 2202, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 2212 may transmit electronic signals via a communications interface, such as a wireless, wired, and/or optical communications interface. Examples of wireless and wired communications interfaces include, but are not limited to, cellular and Wi-Fi communications interfaces.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

What is claimed is:

1. An image sensor, comprising:

a semiconductor substrate including a set of substrate portions, each substrate portion of the set of substrate portions electrically isolated from other substrate portions of the set of substrate portions;

a set of photodiodes;

a charge storage node;

a set of charge transfer gates, each charge transfer gate of the set of charge transfer gates disposed on and biased by a different substrate portion of the set of substrate portions, and each charge transfer gate of the set of charge transfer gates operable to selectively connect a respective photodiode of the set of photodiodes to the charge storage node; and a control circuit operable to dynamically bias each substrate portion of the set of substrate portions independently of each other substrate portion of the set of substrate portions.

2. The image sensor of claim 1, wherein the image sensor comprises a set of pixels, and the image sensor further comprises:

a set of transistors shared by the set of pixels, the set of transistors including, a first transistor on a first substrate portion of the set of substrate portions; and a second transistor on a second substrate portion of the set of substrate portions.

3. The image sensor of claim 1, wherein the image sensor comprises a set of pixels, and the image sensor further comprises:

a set of transistors shared by the set of pixels, the set of transistors including, a first transistor on a first substrate portion of the set of substrate portions;

a second transistor on a second substrate portion of the set of substrate portions; and a third transistor on a third substrate portion of the set of substrate portions.

4. The image sensor of claim 3, wherein:

the first transistor is a charge storage node reset transistor;

the second transistor is a charge storage node readout transistor; and the third transistor is a readout select transistor.

5. The image sensor of claim 4, wherein:

the set of transistors further includes a fourth transistor on a fourth substrate portion of the set of substrate portions; and the set of photodiodes includes four photodiodes, each photodiode of the four photodiodes on a respective substrate portion of the first substrate portion, the second substrate portion, the third substrate portion, and the fourth substrate portion.

6. The image sensor of claim 1, wherein:

the control circuit is operable in a first mode and a second mode;

all substrate portions of the set of substrate portions are biased to a first potential or one substrate portion of the set of substrate portions is biased to a second potential while other substrate portions of the set of substrate portions are biased to the first potential in the first mode; and all substrate portions of the set of substrate portions are biased to a first potential or a second potential in the second mode.

7. The image sensor of claim 1, further comprising:

an array of substrate portions including the set of substrate portions, each substrate portion of the array of substrate portions electrically isolated from other substrate portions of the array of substrate portions;

an array of photodiodes including the set of photodiodes; and an array of charge storage nodes including the charge storage node, each charge storage node in the array of charge storage nodes connected to a different set of photodiodes by a respective different set of charge transfer gates.

8. The image sensor of claim 1, wherein the charge storage node is a floating diffusion node.

9. The image sensor of claim 1, wherein each photodiode of the set of photodiodes is disposed within a respective substrate portion of the set of substrate portions.

10. The image sensor of claim 1, further comprising oxide walls providing at least some of the electrical isolation between the substrate portions of the set of substrate portions.

11. An image sensor, comprising:

at least one substrate; and a set of pixels on the at least one substrate, a pixel in the set of pixels including, a first substrate portion of the at least one substrate;

a second substrate portion of the at least one substrate, the second substrate portion electrically isolated from the first substrate portion;

a third substrate portion of the at least one substrate, the third substrate portion electrically isolated from the first substrate portion and the second substrate portion;

a first photodiode;

a second photodiode;

a charge storage node;

a first charge transfer gate on and biased by the first substrate portion, the charge transfer gate operable to selectively couple the first photodiode to the charge storage node;

a second charge transfer gate on and biased by the third substrate portion, the second charge transfer gate operable to selectively couple the second photodiode to the charge storage node; and at least one transistor on and biased by the second substrate portion.

12. The image sensor of claim 11, further comprising a control circuit operable to bias each of the first substrate portion and the second substrate portion independently of other substrate portions of the at least one substrate.

13. The image sensor of claim 11, wherein:

the at least one substrate includes a substrate that defines both the first substrate portion and the second substrate portion; and at least one oxide wall in the substrate electrically isolates the second substrate portion from the first substrate portion.

14. The image sensor of claim 11, wherein:

the at least one substrate includes a substrate stack, the substrate stack including a first substrate and a second substrate;

the first substrate includes the first substrate portion; and the second substrate includes the second substrate portion.

15. The image sensor of claim 11, wherein the at least one transistor includes at least one of:

a charge storage node reset transistor;

a charge storage node readout transistor; or a readout select transistor.

16. The image sensor of claim 11, wherein the at least one transistor on and biased by the second substrate portion comprises at least one transistor used to read a value of a charge stored in the charge storage node.

17. An image sensor, comprising:

a semiconductor substrate;

a pixel including, a photodiode;

a charge storage node; and a charge transfer gate disposed on and biased by a potential of the semiconductor substrate, the charge transfer gate operable to selectively connect the photodiode to the charge storage node; and a control circuit operable to:

dynamically bias the potential of the semiconductor substrate to a first potential during a charge transfer mode in which charge is transferred from the photodiode to the charge storage node;

dynamically bias the potential of the semiconductor substrate to a second potential different from the first potential during a readout mode in which charge is read from the charge storage node; and dynamically bias the potential of the semiconductor substrate to a third potential different from the first potential and the second potential during at least an integration mode of operation of the pixel in which charge is integrated by the photodiode.

18. The image sensor of claim 17, further including:

a set of pixel transistors disposed on and biased by the semiconductor substrate, the set of pixel transistors operable to reset and read the pixel, the set of pixel transistors including, a charge storage node reset transistor;

a charge storage node readout transistor; and a readout select transistor.

* * * * *